(12) United States Patent
Lee et al.

(10) Patent No.: US 7,464,917 B2
(45) Date of Patent: Dec. 16, 2008

(54) AMPOULE SPLASH GUARD APPARATUS

(75) Inventors: Wei Ti Lee, San Jose, CA (US); Steve H. Chiao, San Jose, CA (US)

(73) Assignee: Appiled Materials, Inc., Santa Clara, CA (US)

( * ) Notice: Subject to any disclaimer, the term of this patent is extended or adjusted under 35 U.S.C. 154(b) by 445 days.

(21) Appl. No.: 11/246,890

(22) Filed: Oct. 7, 2005

(65) Prior Publication Data

US 2007/0079759 A1    Apr. 12, 2007

(51) Int. Cl.
*B01F 3/04* (2006.01)
(52) U.S. Cl. .............................. 261/121.1; 261/DIG. 65
(58) Field of Classification Search ............... 261/121.1, 261/122.1, DIG. 65
See application file for complete search history.

(56) References Cited

U.S. PATENT DOCUMENTS

| | | | |
|---|---|---|---|
| 240,320 A * | 4/1881 | Mallinckrodt | 96/346 |
| 1,017,900 A * | 2/1912 | Phillips | 96/348 |
| 1,271,306 A * | 7/1918 | Fox | 261/78.1 |
| 1,664,333 A * | 3/1928 | Taylor | 96/348 |
| 1,664,670 A * | 4/1928 | Dollins | 96/347 |
| 4,058,430 A | 11/1977 | Suntola et al. | |
| 4,094,643 A * | 6/1978 | Cook et al. | 422/194 |
| 4,266,950 A * | 5/1981 | Makino et al. | 261/93 |
| 4,389,973 A | 6/1983 | Suntola et al. | |
| 4,413,022 A | 11/1983 | Suntola et al. | |
| 4,415,275 A | 11/1983 | Dietrich | |
| 4,761,269 A | 8/1988 | Conger et al. | |
| 4,834,831 A | 5/1989 | Nishizawa et al. | |
| 4,975,252 A | 12/1990 | Nishizawa et al. | |
| 4,993,357 A | 2/1991 | Scholz | |
| 5,027,746 A | 7/1991 | Frijlink et al. | |
| 5,173,327 A | 12/1992 | Sandhu et al. | |
| 5,178,681 A | 1/1993 | Moore et al. | |
| 5,225,366 A | 7/1993 | Yoder | |
| 5,261,959 A | 11/1993 | Gasworth | |

(Continued)

FOREIGN PATENT DOCUMENTS

EP       0 497 267       8/1992

(Continued)

OTHER PUBLICATIONS

International Search Report and Written Opinion dated Aug. 30, 2007 for International Application No. PCT/US06/37217.

*Primary Examiner*—Scott Bushey
(74) *Attorney, Agent, or Firm*—Patterson & Sheridan, LLP

(57) ABSTRACT

Embodiments of the invention provide an apparatus for generating a precursor gas used in a vapor deposition process system. The apparatus contains a canister or an ampoule for containing a chemical precursor and a splash guard contained within the ampoule. The splash guard is positioned to obstruct the chemical precursor in a liquid state from being bumped or splashed into a gas outlet during the introduction of a carrier gas into the ampoule. The carrier gas is usually directed into the ampoule through a gas inlet and combines with the vaporized chemical precursor to form a precursor gas. The splash guard is also positioned to permit the passage of the precursor gas from the gas outlet. In one example, the gas outlet contains a stem with a tapered tip and the splash guard is positioned at an angle parallel to the plane of the tapered tip.

26 Claims, 15 Drawing Sheets

U.S. PATENT DOCUMENTS

| | | |
|---|---|---|
| 5,281,274 A | 1/1994 | Yoder |
| 5,294,286 A | 3/1994 | Nishizawa et al. |
| 5,338,362 A | 8/1994 | Imahashi |
| 5,374,570 A | 12/1994 | Nasu et al. |
| 5,441,703 A | 8/1995 | Jurgensen |
| 5,443,647 A | 8/1995 | Aucoin et al. |
| 5,480,818 A | 1/1996 | Matsumoto et al. |
| 5,483,919 A | 1/1996 | Yokoyama et al. |
| 5,503,875 A | 4/1996 | Imai et al. |
| 5,520,858 A * | 5/1996 | Yamaguchi et al. ......... 261/130 |
| 5,674,786 A | 10/1997 | Turner et al. |
| 5,711,811 A | 1/1998 | Suntola et al. |
| 5,730,802 A | 3/1998 | Ishizumi et al. |
| 5,796,116 A | 8/1998 | Nakata et al. |
| 5,807,792 A | 9/1998 | Ilg et al. |
| 5,835,677 A | 11/1998 | Li et al. |
| 5,855,680 A | 1/1999 | Soininen et al. |
| 5,879,459 A | 3/1999 | Gadgli et al. |
| 5,916,365 A | 6/1999 | Sherman |
| 5,972,430 A | 10/1999 | DiMeo, Jr. et al. |
| 6,015,590 A | 1/2000 | Suntola et al. |
| 6,042,652 A | 3/2000 | Hyun et al. |
| 6,071,572 A | 6/2000 | Mosely et al. |
| 6,139,700 A | 10/2000 | Kang et al. |
| 6,174,377 B1 | 1/2001 | Doering et al. |
| 6,183,563 B1 | 2/2001 | Choi et al. |
| 6,197,683 B1 | 3/2001 | Kang et al. |
| 6,200,893 B1 | 3/2001 | Sneh |
| 6,220,091 B1 * | 4/2001 | Chen et al. ..................... 73/302 |
| 6,231,672 B1 | 5/2001 | Choi et al. |
| 6,270,572 B1 | 8/2001 | Kim et al. |
| 6,302,965 B1 | 10/2001 | Umotoy et al. |
| 6,305,314 B1 | 10/2001 | Sneh et al. |
| 6,306,216 B1 | 10/2001 | Kim et al. |
| 6,431,118 B1 * | 8/2002 | Woltmann .................. 119/246 |
| 6,447,607 B2 | 9/2002 | Soininen et al. |
| 6,478,872 B1 | 11/2002 | Chae et al. |
| 6,481,945 B1 | 11/2002 | Hasper et al. |
| 6,511,539 B1 | 1/2003 | Raaijmakers |
| 6,520,218 B1 | 2/2003 | Gregg et al. |
| 6,551,406 B2 | 4/2003 | Kilpi |
| 6,572,705 B1 | 6/2003 | Suntola et al. |
| 6,578,287 B2 | 6/2003 | Aswad |
| 6,579,372 B2 | 6/2003 | Park |
| 6,593,484 B2 | 7/2003 | Yasuhara et al. |
| 6,630,030 B1 | 10/2003 | Suntola et al. |
| 6,630,201 B2 | 10/2003 | Chiang et al. |
| 6,660,126 B2 | 12/2003 | Nguyen et al. |
| 6,716,287 B1 | 4/2004 | Santiago et al. |
| 6,718,126 B2 | 4/2004 | Lei |
| 6,734,020 B2 | 5/2004 | Lu et al. |
| 6,772,072 B2 | 8/2004 | Ganguli et al. |
| 6,773,507 B2 | 8/2004 | Jallepally et al. |
| 6,777,352 B2 | 8/2004 | Tepman et al. |
| 6,778,762 B1 | 8/2004 | Shareef et al. |
| 6,815,285 B2 | 11/2004 | Choi et al. |
| 6,818,094 B2 | 11/2004 | Yudovsky |
| 6,821,563 B2 | 11/2004 | Yudovsky |
| 6,866,746 B2 | 3/2005 | Lei et al. |
| 6,868,859 B2 | 3/2005 | Yudovsky |
| 6,921,062 B2 | 7/2005 | Gregg et al. |
| 2001/0000866 A1 | 5/2001 | Sneh et al. |
| 2001/0009140 A1 | 7/2001 | Bondestam et al. |
| 2001/0011526 A1 | 8/2001 | Doering et al. |
| 2001/0013312 A1 | 8/2001 | Soininen et al. |
| 2001/0014371 A1 | 8/2001 | Kilpi |
| 2001/0042523 A1 | 11/2001 | Kesala |
| 2001/0042799 A1 | 11/2001 | Kim et al. |
| 2001/0054377 A1 | 12/2001 | Lindfors et al. |
| 2002/0000196 A1 | 1/2002 | Park |
| 2002/0007790 A1 | 1/2002 | Park |
| 2002/0009544 A1 | 1/2002 | McFeely et al. |
| 2002/0009896 A1 | 1/2002 | Sandhu et al. |
| 2002/0017242 A1 | 2/2002 | Hamaguchi et al. |
| 2002/0041931 A1 | 4/2002 | Suntola et al. |
| 2002/0052097 A1 | 5/2002 | Park |
| 2002/0066411 A1 | 6/2002 | Chiang et al. |
| 2002/0073924 A1 | 6/2002 | Chiang et al. |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0086106 A1 | 7/2002 | Park et al. |
| 2002/0092471 A1 | 7/2002 | Kang et al. |
| 2002/0094689 A1 | 7/2002 | Park |
| 2002/0104481 A1 | 8/2002 | Chiang et al. |
| 2002/0108570 A1 | 8/2002 | Lindfors et al. |
| 2002/0110991 A1 | 8/2002 | Li |
| 2002/0115886 A1 | 8/2002 | Yasuhara et al. |
| 2002/0121241 A1 | 9/2002 | Nguyen et al. |
| 2002/0121342 A1 | 9/2002 | Lu et al. |
| 2002/0127745 A1 | 9/2002 | Lu et al. |
| 2002/0134307 A1 | 9/2002 | Choi |
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2003/0004723 A1 | 1/2003 | Chihara |
| 2003/0010451 A1 | 1/2003 | Tzu et al. |
| 2003/0017697 A1 | 1/2003 | Choi et al. |
| 2003/0022338 A1 | 1/2003 | Ruben et al. |
| 2003/0042630 A1 | 3/2003 | Babcoke et al. |
| 2003/0053顺727 A1 | 3/2003 | Lei |
| 2003/0057527 A1 | 3/2003 | Chung et al. |
| 2003/0072913 A1 | 4/2003 | Chou et al. |
| 2003/0075273 A1 | 4/2003 | Kilpela et al. |
| 2003/0075925 A1 | 4/2003 | Lindfors et al. |
| 2003/0079686 A1 | 5/2003 | Chen et al. |
| 2003/0089308 A1 | 5/2003 | Raaijmakers |
| 2003/0101927 A1 | 6/2003 | Raaijmakers |
| 2003/0101938 A1 | 6/2003 | Ronsse et al. |
| 2003/0106490 A1 | 6/2003 | Jallepally et al. |
| 2003/0113187 A1 | 6/2003 | Lei et al. |
| 2003/0116019 A1 * | 6/2003 | Torkaman ..................... 95/226 |
| 2003/0116087 A1 | 6/2003 | Nguyen et al. |
| 2003/0121469 A1 | 7/2003 | Lindfors et al. |
| 2003/0121608 A1 | 7/2003 | Chen et al. |
| 2003/0140854 A1 | 7/2003 | Kilpi |
| 2003/0143328 A1 | 7/2003 | Chen et al. |
| 2003/0143747 A1 | 7/2003 | Bondestam et al. |
| 2003/0153177 A1 | 8/2003 | Tepman et al. |
| 2003/0172872 A1 | 9/2003 | Thakur et al. |
| 2003/0194493 A1 | 10/2003 | Chang et al. |
| 2003/0198754 A1 | 10/2003 | Xi et al. |
| 2003/0213560 A1 | 11/2003 | Wang et al. |
| 2003/0216981 A1 | 11/2003 | Tillman |
| 2003/0219942 A1 | 11/2003 | Choi et al. |
| 2003/0221780 A1 | 12/2003 | Lei et al. |
| 2003/0224107 A1 | 12/2003 | Lindfors et al. |
| 2003/0235961 A1 | 12/2003 | Metzner et al. |
| 2004/0005749 A1 | 1/2004 | Choi et al. |
| 2004/0011404 A1 | 1/2004 | Ku et al. |
| 2004/0011504 A1 | 1/2004 | Ku et al. |
| 2004/0013577 A1 | 1/2004 | Ganguli et al. |
| 2004/0014320 A1 | 1/2004 | Chen et al. |
| 2004/0015300 A1 | 1/2004 | Ganguli et al. |
| 2004/0016404 A1 | 1/2004 | Gregg et al. |
| 2004/0025370 A1 | 2/2004 | Guenther et al. |
| 2004/0065255 A1 | 4/2004 | Yang et al. |
| 2004/0069227 A1 | 4/2004 | Ku et al. |
| 2004/0071897 A1 | 4/2004 | Verplancken et al. |
| 2004/0144308 A1 | 7/2004 | Yudovsky |
| 2004/0144311 A1 | 7/2004 | Chen et al. |
| 2004/0219784 A1 | 11/2004 | Kang et al. |
| 2004/0224506 A1 | 11/2004 | Choi et al. |
| 2004/0235285 A1 | 11/2004 | Kang et al. |

| | | | | | |
|---|---|---|---|---|---|
| 2005/0006799 A1 | 1/2005 | Gregg et al. | JP | 2000-212752 | 8/2000 |
| 2005/0059240 A1 | 3/2005 | Choi et al. | JP | 2000-319772 | 11/2000 |
| 2005/0095859 A1 | 5/2005 | Chen et al. | JP | 2001-020075 | 1/2001 |
| 2005/0104142 A1 | 5/2005 | Narayanan et al. | WO | WO 96/17107 | 6/1996 |
| | | | WO | WO 99/01595 | 1/1999 |
| | FOREIGN PATENT DOCUMENTS | | WO | WO 99/65064 | 12/1999 |
| | | | WO | WO 00/54320 | 9/2000 |
| EP | 1 167 569 | 1/2002 | WO | WO 00/79576 | 12/2000 |
| JP | 58-098917 | 6/1983 | WO | WO 01/17692 | 3/2001 |
| JP | 04-291916 | 10/1992 | WO | WO 01/36702 | 5/2001 |
| JP | 05-047666 | 2/1993 | WO | WO 02/08488 | 1/2002 |
| JP | 05-206036 | 8/1993 | WO | WO 02/45871 | 6/2002 |
| JP | 05-234899 | 9/1993 | WO | WO 03/23835 | 3/2003 |
| JP | 05-270997 | 10/1993 | | | |
| JP | 06-224138 | 8/1994 | * cited by examiner | | |

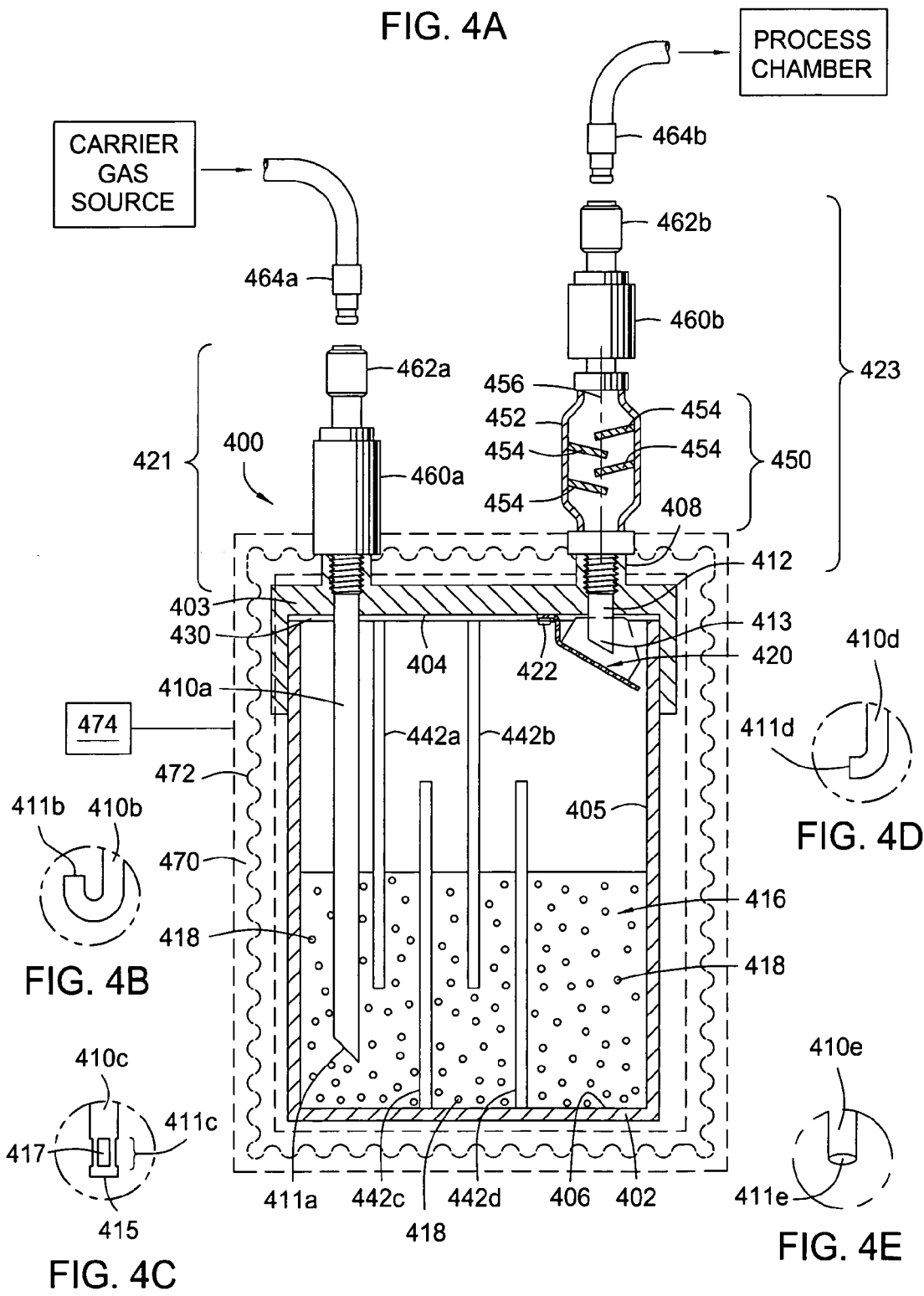

US 7,464,917 B2

AMPOULE SPLASH GUARD APPARATUS

BACKGROUND OF THE INVENTION

1. Field of the Invention

Embodiments of the invention relate to an apparatus used during the vaporization of chemical precursors. More particularly, the invention relates to a splash guard used within an ampoule during a vapor deposition process.

2. Description of the Related Art

Chemical vapor deposition (CVD) and atomic layer deposition (ALD) are known techniques for forming a material on a substrate by the reaction of vapor phase chemicals near the surface of a substrate. In general, CVD and ALD techniques involve the delivery of gaseous reactants to the substrate surface where a chemical reaction takes place under temperature and pressure conditions favorable to the thermodynamics of the reaction. The type and composition of the layers that may be formed using a CVD process or an ALD process are limited by the ability to deliver a chemical reactant or precursor to the substrate surface. Various liquid precursors have been successfully used during CVD and ALD applications by delivering the liquid precursors within a carrier gas.

In the prior related art, a carrier gas is usually passed through a heated container containing a volatile liquid precursor at conditions conducive to vaporize of the precursor. The carrier gas combines with the vaporized precursor and both are drawn from the container to the reaction chamber. Prior known liquid precursor delivery apparatuses and procedures have been unsuccessful in reliably delivering the precursor to the reaction chamber. In some cases, the liquid precursor is vaporized within the container but condenses throughout the conduit or tubing of the delivery line. The temperature of the container or the flow rate of the carrier gas may be increased to prevent condensation within the delivery line in some processes, if the chemical precursor or the fabrication process can tolerate such temperature or flow rate.

Bumping or splashing of the chemical precursor is another problem encountered while using a liquid precursor during a vapor deposition process. Splashing occurs when a portion of the chemical precursor is ejected away from the main supply of precursor by the introduction of a carrier gas into the ampoule. Often, the precursor, in a liquefied state, is bumped or splashed into the outlet of the ampoule and may block the delivery line, clog valves or contaminate the substrate surface.

Therefore, there is a need for an apparatus and process to deliver vaporized chemical precursors from a container while preventing or limiting non-vaporized chemical precursors out of the container during a fabrication process.

SUMMARY OF THE INVENTION

In embodiments of the invention, an apparatus for generating a precursor gas used in a vapor deposition process system is provided which includes a canister or an ampoule containing a body assembly and a lid, a gas inlet assembly positioned on the lid and configured to accept a carrier gas flow into the ampoule and a gas outlet assembly positioned on the lid and configured to accept a process gas flow containing a vaporized chemical precursor from the ampoule. The apparatus further provides a splash guard positioned within the ampoule to obstruct a liquid precursor (i.e., a precursor in the liquid state of matter) from entering the gas outlet. In one example, the splash guard is positioned at an angle within a range from about 0° to about 70°, measured from an interior lid surface to a surface of the splash guard. Preferably, the angle is within a range from about 10° to about 50°, and more preferably, from about 20° to about 40°, such as about 30°.

The gas inlet assembly further contains a gas inlet stem that may have a tapered tip and the gas outlet assembly contains a gas outlet stem that may also have a tapered tip. In one example, the tapered tip on the gas inlet stem is positioned to face away from the gas outlet. The gas inlet stem may have a tip tapered at an angle within a range from about 0° to about 45°, measured from a bottom surface of the body assembly to the tapered tip surface of the gas inlet stem. Preferably, the angle is within a range from about 5° to about 30°, and more preferably, from about 5° to about 15°, such as about 10°. The gas outlet stem may have a tip tapered at an angle within a range from about 0° to about 70°, measured from an interior lid surface to tapered tip surface of the gas outlet stem. Preferably, the angle is within a range from about 10° to about 50°, and more preferably, from about 20° to about 40°, such as about 30°.

In one example, a splash guard is positioned at an angle equal or substantially equal to the tapered tip of the gas outlet tip. Preferably, the splash guard is positioned between a liquid precursor and the tapered tip of the gas outlet stem and at an angle perpendicular or substantially perpendicular to a line of sight from the liquid precursor to the tapered tip of the gas outlet stem. In another example, the splash guard is attached to an inner surface of the canister or the ampoule and extending from the inner surface to obstruct a liquid precursor from entering the gas outlet.

In another embodiment, an apparatus for generating precursor gas within a process system is provided which includes a canister containing a body assembly and a lid, a gas inlet positioned on the canister and configured to provide an entrance for a gas into canister, a gas outlet configured to receive a process gas flowing from the canister, an outlet stem connected to the gas outlet containing a tapered tip having a first angle, a splash guard within the canister containing a surface positioned at a second angle, wherein the first angle and the second angle are equal or substantially equal to each other.

In another embodiment, the splash guard is positioned between the gas outlet and a bottom surface of the body assembly within the canister, wherein the splash guard is positioned to substantially obstruct the liquid precursor from entering the gas outlet. In one example, the splash guard is attached to an inner surface of the canister and extending from the inner surface to obstruct a liquid precursor from entering the gas outlet at an angle within a range from about 10° to about 50° from an interior lid surface.

In another embodiment, an apparatus for generating a precursor gas within a process system is provided which includes a modular, isolatable, transportable canister adapted for use in a gas panel of a delivery system connected to a process chamber, a gas inlet adapted to receive a carrier gas, a gas outlet adapted to disperse a process gas containing a precursor and a splash guard positioned to obstruct a liquid precursor from entering the gas outlet.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 4A is a cross sectional schematic view of a precursor ampoule and splash guard as described by another embodiment herein;

FIGS. 4B-4E are simplified schematic views of various tips of inlet stems as described by alternative embodiments herein;

DETAILED DESCRIPTION

Embodiments of the invention provide an apparatus for generating a precursor gas used in a vapor deposition process system. The apparatus contains a canister or an ampoule for containing a chemical precursor and a splash guard contained within the ampoule. The splash guard is positioned to obstruct the chemical precursor in a liquid state from being bumped or splashed into a gas outlet during the introduction of a carrier gas into the ampoule. The carrier gas is usually directed into the ampoule through a gas inlet and combines with the vaporized chemical precursor to form a precursor gas. The splash guard is also positioned to permit the passage of the precursor gas from the gas outlet. In one example, the gas outlet contains a stem with a tapered tip and the splash guard is positioned at an angle (e.g., about 30°) parallel to the tapered tip. In another example, the gas inlet contains a stem with a tapered tip positioned to face away from the gas outlet. Therefore, splashed or bumped liquid precursor is directed away from the gas outlet to further reduce the possibility of the liquid precursor from entering the gas outlet. In one example, the gas inlet stem may have the tapered tip at an angle of about 10°.

Figure 1:
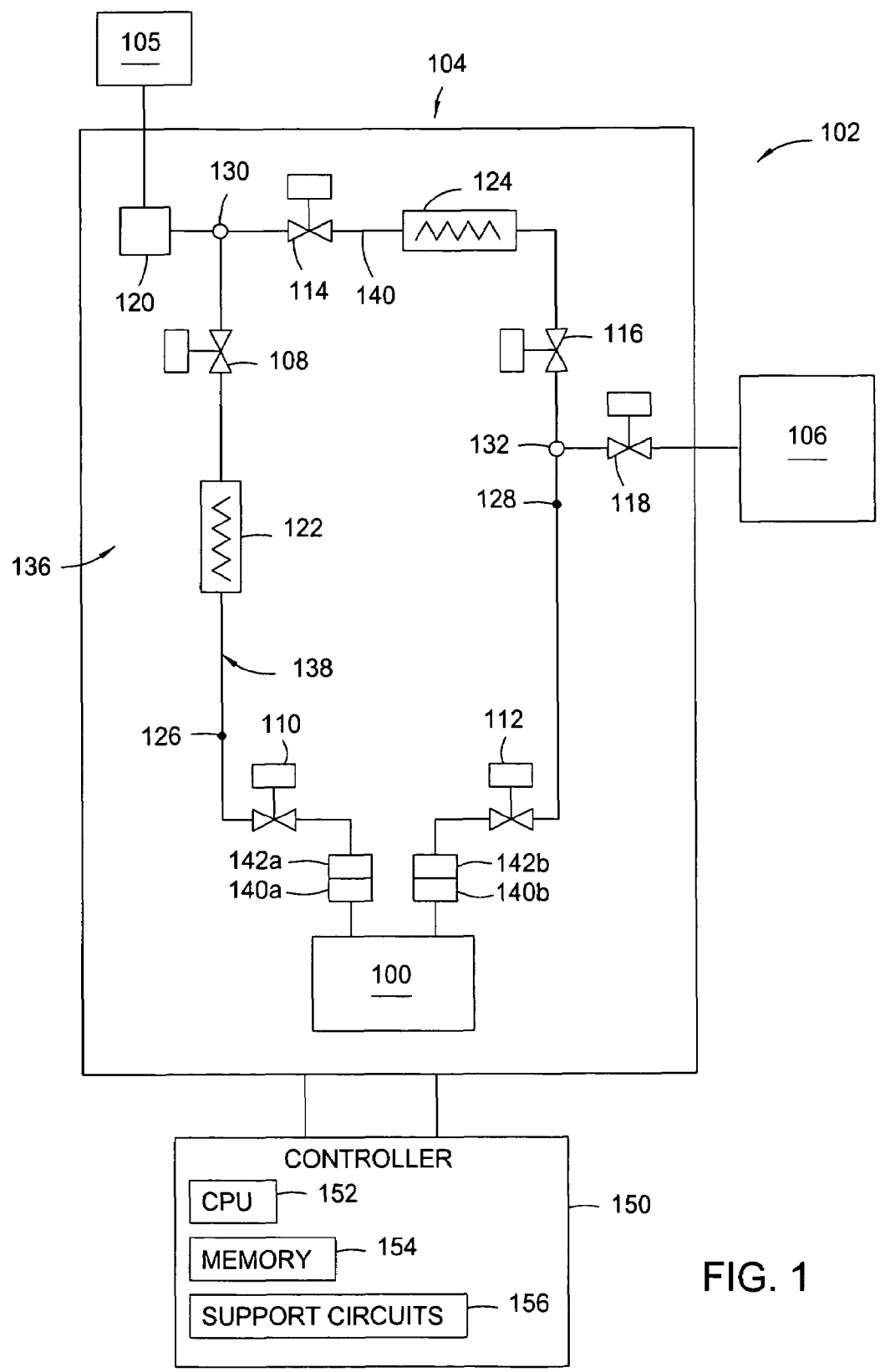
FIG. 1 is a simplified schematic view of a process system having a gas generation system as described by an embodiment herein.

FIG. 1 generally depicts a simplified schematic of gas delivery system 102, which is suitable for producing a process gas containing a chemical precursor. Gas delivery system 102 generally includes process chamber 106 coupled to gas panel 104. Gas panel 104 generally controls the rate and pressure at which various process and carrier gases are delivered to process chamber 106. Process chamber 106 may be a chamber to conduct vapor deposition processes or thermal processes containing a vaporized chemical precursor in liquid, gaseous or plasma state. Process chamber 106 is generally a chemical vapor deposition (CVD) chamber, an atomic layer deposition (ALD) chamber, a physical vapor deposition (PVD) chamber, a thermal anneal chamber or derivative thereof.

Gas delivery circuit 136 is generally coupled between carrier gas source 105 and process chamber 106. Carrier gas source 105 may be a local vessel, remote vessel or a centralized facility source that supplies the carrier gas throughout the facility (e.g., in-house gas supply). Carrier gas source 105 typically supplies a carrier gas such as nitrogen, hydrogen, argon, helium or combinations thereof. Gas delivery circuit 136 typically includes flow controller 120 disposed between carrier gas source 105 and junction 130 that separates gas delivery circuit 136 into gas generation line 138 and bypass line 140. Junction 132 rejoins gas generation line 138 and bypass line 140 before connecting to process chamber 106. Junctions 130 and 132 may by "T" junctions. Flow controller 120 may be a proportional valve, a modulating valve, a needle valve, a regulator, a mass flow controller (MFC) or the like. An MFC that may be utilized as flow controller 120 is available from Sierra Instruments, Inc., located in Monterey, Calif.

Gas generation line 138 generally includes heater 122 and ampoule 100. Ampoule 100 may include an ampoule, a canister, a bubbler, a cartridge or other container used for containing or dispersing chemical precursors. Suitable ampoules may be available from Applied Materials, Inc., located in Santa Clara, Calif. or the PROE-VAP™, available from Advanced Technology Materials, Inc., located in Danbury, Conn. Valve 108 is coupled between heater 122 and junction 130. Sensor 126 or other means for measuring temperature is coupled to gas generation line 138 between heater 122 and valve 110. Sensor 126 is adapted to detect a metric indicative of a temperature of the carrier gas flowing through gas generation line 138 into ampoule 100. In one embodiment, sensor 126 is a thermocouple disposed against a conduit comprising gas generation line 138. A thermocouple that may be utilized as sensor 126 is available from Davis Instruments, Inc., located in Baltimore, Md. utilized as sensor 126 is available from Davis Instruments, Inc., located in Baltimore, Md.

Ampoule 100 may be coupled between valve 110 and valve 112. In one embodiment, valves 110 and 112 are coupled to gas generation line 138 by disconnect fittings (not shown) to facilitate removal of valves 110 and 112 and ampoule 100 as a unitary assembly from gas generation line 138. In another embodiment, mating disconnect fittings containing female fittings 140a and 140b and male fittings 142a and 142b may be utilized to facilitate removal and replacement of the source ampoule 100 to and from the gas delivery system 102, while leaving valves 110 and 112 are coupled to gas generation line 138.

Junction 132 is coupled between valve 112 and process chamber 106. Junction 132 couples the output of ampoule 100 bypass line 140 to process chamber 106. Sensor 128 or other means for measuring temperature is coupled to gas generation line 138 between valve 112 and junction 132. Sensor 128 is adapted to detect a metric indicative of a temperature of the gases flowing out of ampoule 100.

Bypass line 140 generally includes valve 114 coupled between heater 124 and junction 130 and valve 116 is coupled between heater 124 and junction 132. Valve 118 is generally coupled between junction 132 and process chamber 106 and may be used to isolate process chamber 106 from gas delivery circuit 136.

Valves 108, 110, 112, 114, 116 and 118 are typically shut off valves used to divert the flow of gases within gas delivery circuit 136 or used to selectively isolate the various components within gas delivery circuit 136 to facilitate removal, replacement and/or service of an isolated component. Valves 110, 112, 116 and 118 are fabricated from materials compatible with the process and other gases handled by gas delivery circuit 136. In one embodiment, valves 110, 112, 116 and 118 may have valve bodies fabricated from stainless steel or nickel alloys and utilized KEL-F® seals or CHEMREZ® seals. Valves 108 and 114 are fabricated from materials compatible with the carrier gas. Typically, valves 108, 110, 112, 114, 116 and 118 are actuated in response to a signal from controller 150 to coordinate the delivery of gases through gas delivery circuit 136. Valves that may be utilized are available from Parker-Hannifin Corp., located in Cleveland, Ohio.

In one embodiment, controller 150 includes central processing unit (CPU) 152, memory 154 and support circuits 156. Central processing unit 152 may be one of any form of computer processor that can be used in an industrial setting for controlling various chambers and subprocessors. Memory 154 is coupled to CPU 152 and may be one or more of readily available memory such as random access memory (RAM), read only memory (ROM), flash memory, compact disc, floppy disk, hard disk or any other form of local or remote digital storage. Support circuits 156 are coupled to CPU 152 for supporting CPU 152 in a conventional manner. These circuits include cache, power supplies, clock circuits, input/output circuitry, subsystems and the like.

Heaters 122 and 124 may be any heating elements adapted to heat a flow of gas traveling in gas generation line 138 and bypass line 140. In one example, heaters 122 and 124 may be a block of material disposed proximate, against or circumscribing gas generation line 138 and bypass line 140 and having a cartridge heater or a heat transfer fluid flowing therethrough. In another, heaters 122 and 124 may be a surface heater disposed against or proximate the conduits comprising gas generation line 138 and bypass line 140, and are commercially available from many sources, including from Watlow Electric Manufacturing Company, located in St. Louis, Missouri. Ampoule 100, heaters 122 and 124, gas generation line 138 and bypass line 140 may be covered or wrapped with a thermally insulating material to assist the maintenance of a constant temperature.

Examples of process chamber 106 include PRODUCER® CVD chambers, DzX® CVD chambers and ENDURA® PVD chambers available from Applied Materials, Inc., located in Santa Clara, Calif. Also, process chamber 106 may be an ALD chamber as described in commonly assigned U.S. Pat. No. 6,916,398, commonly assigned and co-pending U.S. patent Ser. No. 10/281,079, filed Oct. 25, 2002, entitled, "Gas Delivery Apparatus for Atomic Layer Deposition," and published as US 20030121608, and commonly assigned and co-pending U.S. patent application Ser. No. 11/127,753, filed May 12, 2005, and entitled, "Apparatuses and Methods for Atomic Layer Deposition of Hafnium-containing High-K Materials," which are each incorporated herein in their entirety by reference. Process chamber 106 may also be an annealing chamber, such as the CENTURA™ RADIANCE™ RTP chamber available from Applied Materials, Inc., located in Santa Clara, Calif. The vaporized precursor gas may enter process chamber 106 through a conduit or a nozzle as described in commonly assigned U.S. patent Ser. No. 11/119,388, filed Apr. 29, 2005, entitled, "Control of Gas Flow and Delivery to Suppress the Formation of Particles in an MOCVD/ALD System," which is incorporated herein by reference to support disclosure of the gradually expanding gas conduits.

FIGS. 2A-2D illustrate several perspectives of ampoule 200. Ampoule 200 may be referred to as an ampoule, a container, a bubbler, a canister and other terms known in the art to describe containers designed and used to store, transport and distribute chemical precursors. Ampoule 200 contains body assembly 201 to store a chemical precursor and lid assembly 204 with lid 206. Generally, body assembly 201 and lid assembly 204 are separable units, however, an alternative embodiment of the invention provides body assembly 201 and lid assembly 204 as a single formed unit.

Body assembly 201 and lid 206 are generally fabricated from a material substantially inert to the chemical precursor stored within and the gas produced therefrom, and thus, the material of construction may vary based on the predetermined chemical precursor. Usually, body assembly 201 and lid 206 are fabricated from stainless steel, aluminum, iron, chromium, nickel, alloys thereof or combinations thereof.

Body assembly 201 may have any number of geometric forms. In the embodiment depicted in FIGS. 2A-2D, body assembly 201 contains a cylindrical body 202 and bottom 214 sealed by lid assembly 204. The joint between body assembly 201 and lid assembly 204 may have a seal, o-ring, gasket, or the like, disposed therebetween and held together by fasteners 208 (e.g., bolt, screw, threads) to prevent leakage from ampoule 200. Alternately, the joint between lid assembly 204 may be coupled to body assembly 201 by welding, bonding, adhesion or other leak-tight method. Body 202 may alternatively comprise other hollow geometric forms (e.g., oval or rectangular), for example, a hollow square tube.

Lid assembly 204 contains inlet assembly 203 and outlet assembly 213 positioned on lid 206 to allow gas flow into and out of ampoule 200. Inlet assembly 203 contains pneumatic valve assembly 210a, conduit 211a manual valve assembly 212a and gas inlet 230, while outlet assembly 213 contains pneumatic valve assembly 210b, conduit 211b, manual valve assembly 212b and gas outlet 232. Conduit 211a may be connected between gas inlet 230 and manual valve assembly 212a, between manual valve assembly 212a and pneumatic valve assembly 210a and between pneumatic valve assembly 210a and lid 206. Conduit 211b may be connected between gas outlet 232 and manual valve assembly 212bb, between manual valve assembly 212bb and pneumatic valve assembly 210b and between pneumatic valve assembly 210b and lid 206.

Inlet assembly 203 and outlet assembly 213 may be connected by valve support 220 and held into place with fasteners 233 (e.g., bolt or screw) or alternatively, valve support 220 may be welded to inlet assembly 203 and outlet assembly 213. Gas inlet 230 and gas outlet 232 may each be fitted with a mating disconnect fitting to be coupled to gas delivery system 102. For example, gas inlet 230 may be connected to a female fitting 140a that couples to male fitting 142a connected to gas delivery system 102. Similarly, gas outlet 232 may be connected to a female fitting 140b that couples to male fitting 142b connected to gas delivery system 102.

Figure 2A:
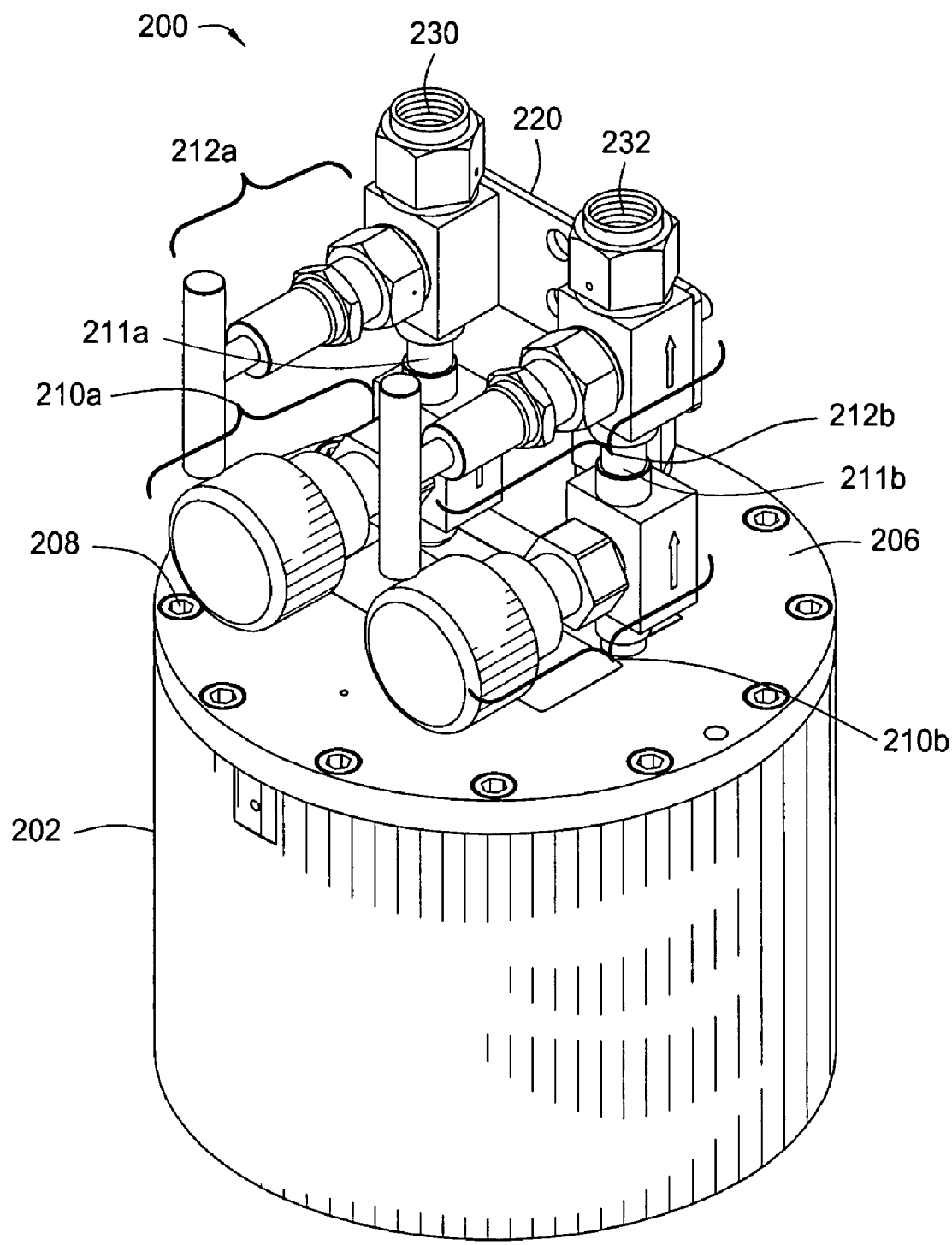
FIGS. 2A-2D are schematic views of a precursor ampoule as described by an embodiment herein.
Figure 2B:
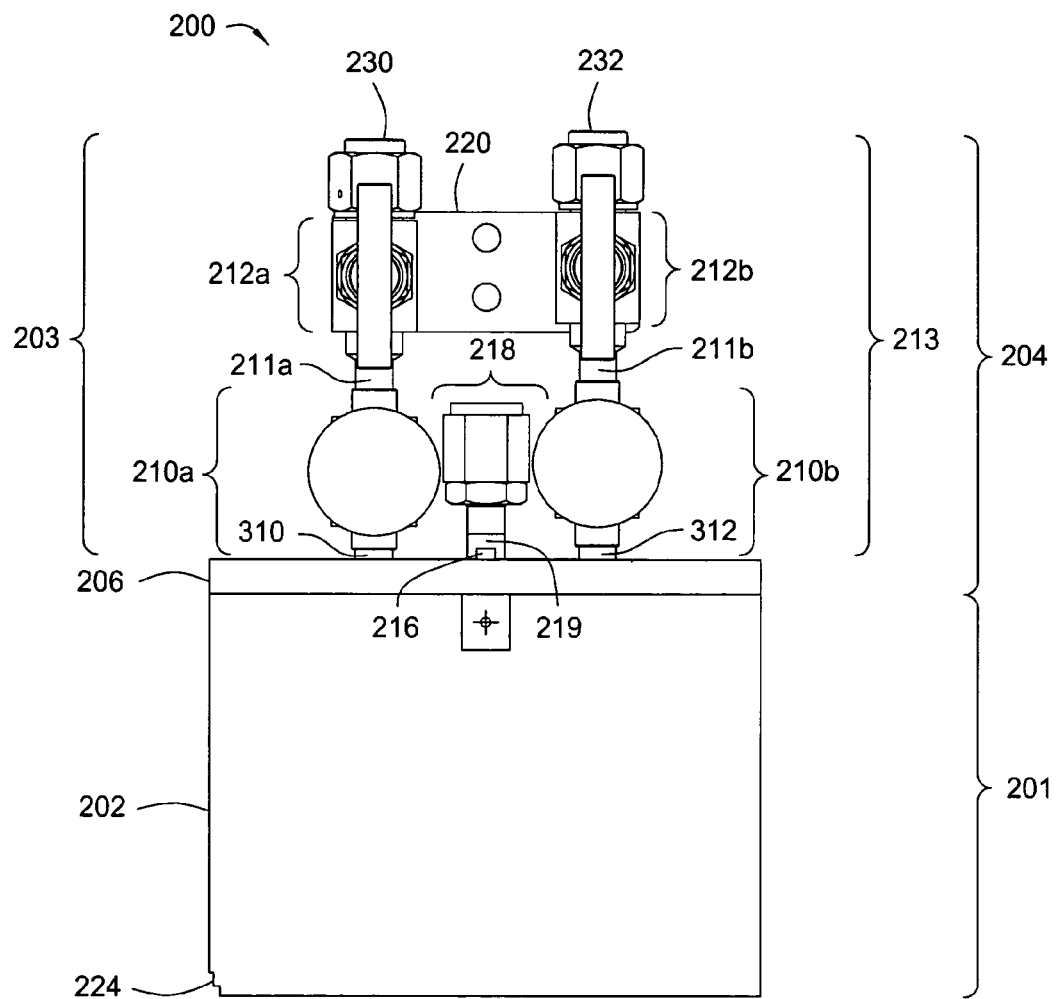
Figure 2C:
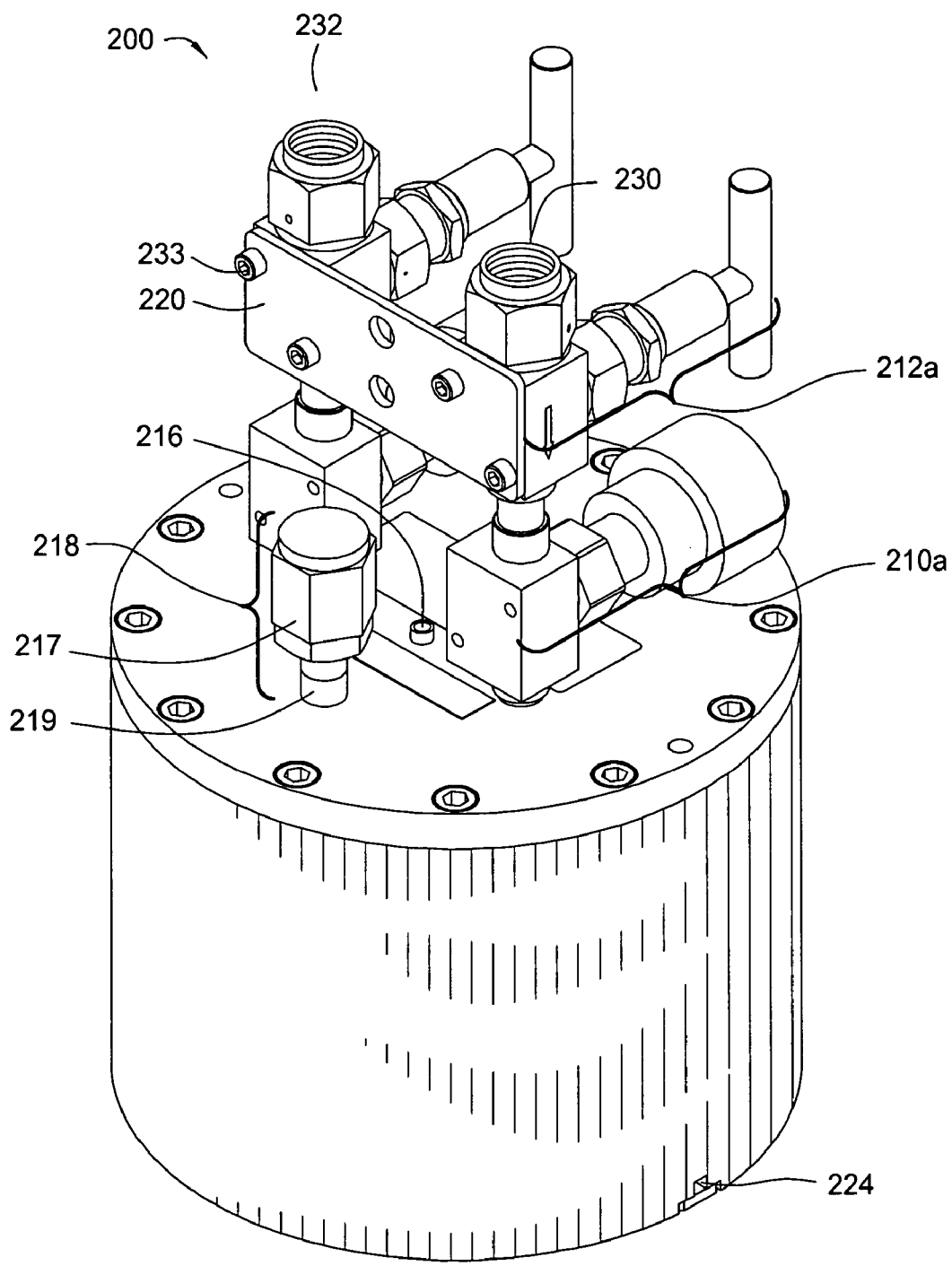
Figure 2D:
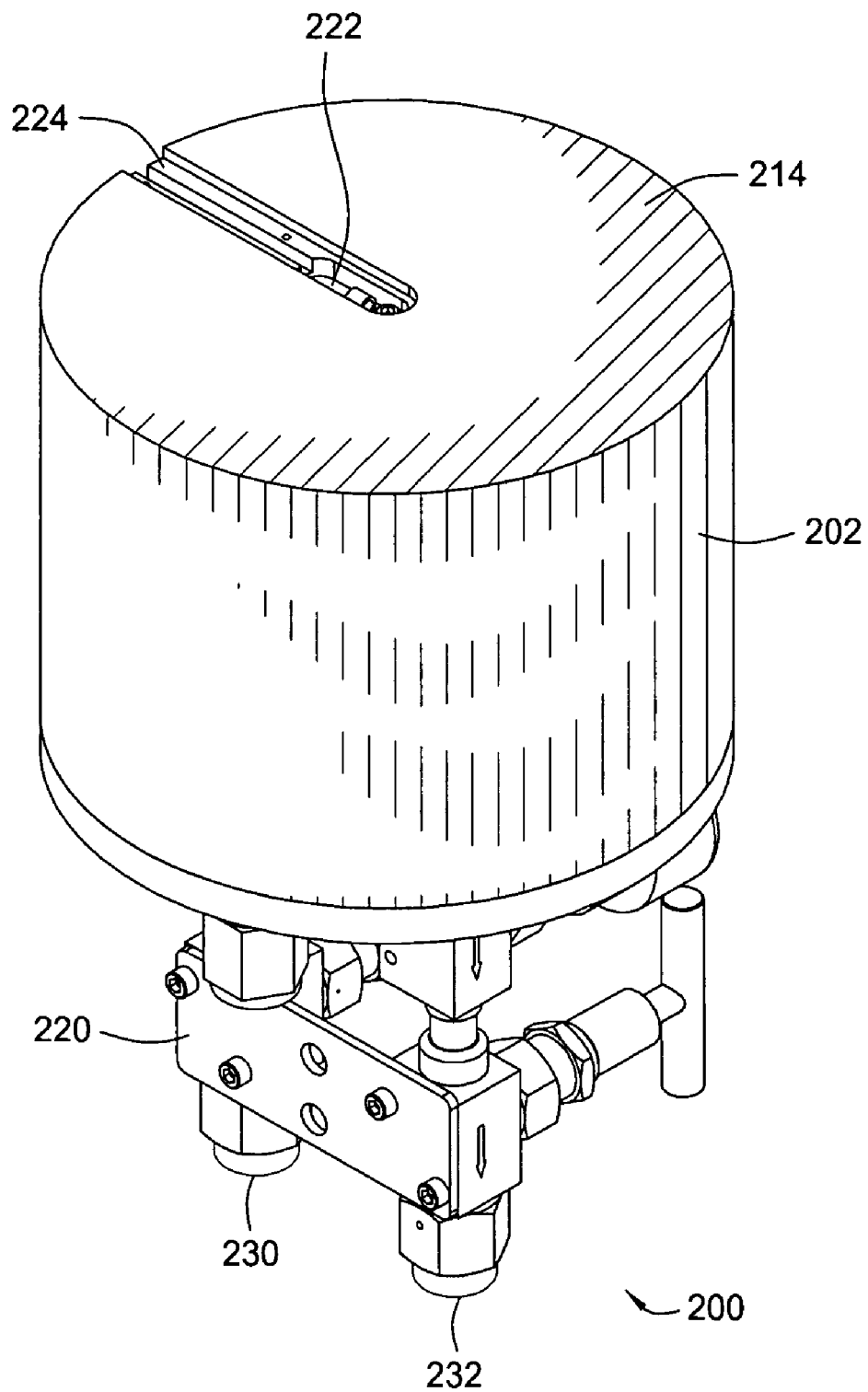

FIGS. 2B-2C illustrates refill port 218 with tube 219 and VCR fitting 217 disposed on lid assembly 204. Tube 219 protrudes through lid 206 and into the interior of ampoule 200. Tube 219 is open-ended and in fluid communication with the interior of ampoule 200. Ampoule 200 may be refilled with chemical precursor through refill port 218. Capped tube 216 is also disposed on lid assembly 204 and protrudes through lid 206 and into the interior of ampoule 200. An external thermocouple, thermometer or other sensor may be positioned into capped tube 216 and used to monitor the internal temperature of ampoule 200 and chemical precursors therein. FIG. 2D depicts passage way 224 formed within bottom 214 of ampoule 200. Passage way 224 is formed to accept thermal couple 222, used to monitor the external temperature of ampoule 200.

Ampoule 200 may have a variety of sizes and geometries. Ampoule 200 may have a volume capacitance of a chemical precursor within a range from about 0.5 L to about 10 L, preferably from about 1.0 L to about 6L, and more preferably, from about 1.2 L to about 4L. In one example, ampoule 200 has a volume capacitance of a chemical precursor of about 2.5L. Chemical precursors that may be within ampoule 200 include liquid, solid and gaseous precursors, preferably in liquid or fluid-like states at predetermined temperatures and/ or pressures. For example, a chemical precursor may exist in the solid state at room temperature, but melts to the liquid state upon being heated to a predetermined temperature within the ampoule. Similar, a chemical precursor may exist in the gaseous state at ambient pressure, but condenses to the liquid state upon being pressurized to a predetermined pressure within the ampoule. Chemical precursors may include alane complexes, such as 1-methylpyrolidrazine:alane (MPA, $MeC_4H_3N:AlH_3$), pyridine:alane ($C_4H_4N:AlH_3$), alkylamine alane complexes (e.g., trimethylamine:alane ($Me_3N:AlH_3$), triethylamine:alane ($Et_3N:AlH_3$), dimethylethylamine:alane ($Me_2EtN:AlH_3$)), trimethylaluminum (TMA, $Me_3Al$), triethylaluminum (TEA, $Et_3Al$), tributylaluminum ($Bu_3Al$), dimethylaluminum chloride ($Me_2AlCl$), diethylaluminum chloride ($Et_2AlCl$), dibutylaluminum hydride ($Bu_2AlH$), dibutylaluminum chloride ($Bu_2AlCl$), water, hydrogen peroxide ($H_2O_2$), hydrazine ($N_2H_4$), titanium tetrachloride ($TiCl_4$), tetrakis(dimethylamino) titanium (TDMAT, $(Me_2N)_4Ti$)), tetrakis(diethylamino) titanium (TEMAT, $(Et_2N)_4Ti$)), bis(ethylcyclopentadienyl) ruthenium (($EtCp)_2Ru$), tetrakis(dimethylamino) hafnium (TDMAH, $(Me_2N)_4Hf$)), tetrakis(diethylamino) hafnium (TDEAH, $(Et_2N)_4Hf$)), tetrakis(methylethylamino) hafnium (TMEAH, $(MeEtN)_4Hf$)), tertiaryamylimido-tris(dimethylamido)tantalum (TAIMATA, ($^tAmylN)Ta(NMe_2)_3$, wherein $^tAmyl$ is the tertiaryamyl group ($C_5H_{11}$— or $CH_3CH_2C(CH_3)_2$—), derivatives thereof or combinations thereof.

Figure 3A:
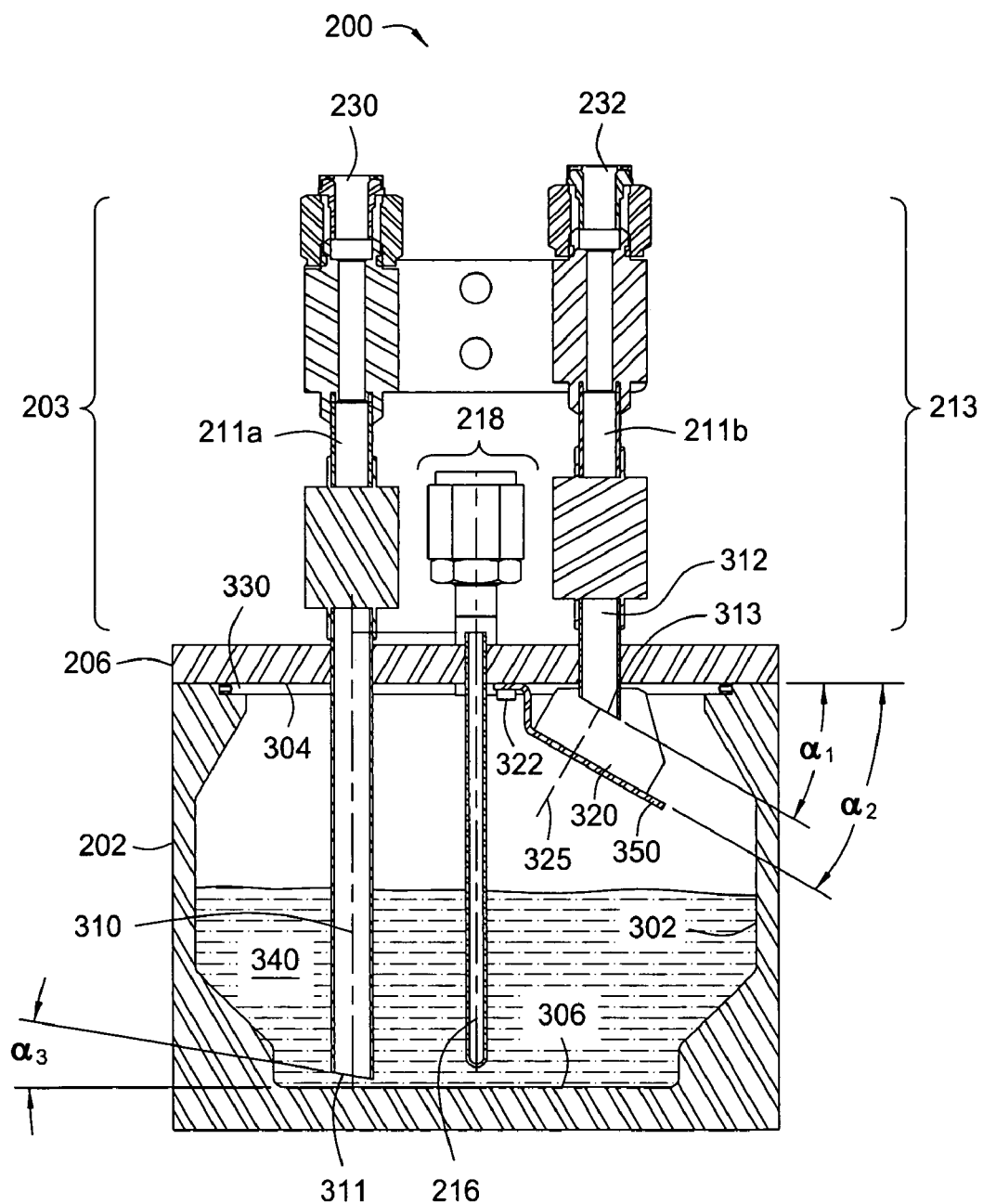
FIG. 3A is a cross sectional schematic view of a precursor ampoule and a splash guard as described by another embodiment herein.

FIG. 3A depicts a cross sectional schematic view of ampoule 200 containing inner wall surface 302, inner lid surface 304 and inner bottom surface 306. Seal 330 is disposed between lid 206 and body 202 to form a gas-tight seal for maintaining chemical precursor 340 within ampoule 200 and for maintaining air from entering ampoule 200. Seal 330 may cover a portion or all of inner lid surface 304. For example, seal 330 may cover a substantial portion of inner lid surface 304 and contain holes for accepting fasteners. Seal 330 may be fabricated from a metal, such as stainless steel, aluminum, nickel, alloys thereof or combinations thereof. Alternatively, seal 330 may be fabricated from polymeric or rubber materials, fluorinated polymers, such as polytetrafluoroethylene (PTFE), polyfluoro-alcohol (PFA), TEFLON®, fluorinated rubbers, nitrile rubbers, derivatives thereof or combinations thereof.

Outlet assembly 213 further contains outlet stem 312 connected to pneumatic valve assembly 210b and lid 206. Outlet stem 312 contains stem tip 313 with a tapered angle $\alpha_1$ relative to the horizontal plane of inner lid surface 304, as shown in FIG. 3A. Generally, angle $\alpha_1$ may be within a range from about 0° to about 70°, preferably from about 10° to about 50°, and more preferably from about 20° to about 40°, for example, about 30°.

Ampoule 200 further contains splash guard 320 attached to inner lid surface 304. Fasteners 322, such as bolts, screws, rivets and the like, may protrude through seal 330 and into inner lid surface 304. Alternatively, splash guard 320 may be positioned onto inner lid surface 304 by other techniques, such as with an adhesion or a welding. Also, splash guard 320 may be attached to inner wall surface 302 or inner bottom surface 306. Splash guard 320 is positioned at angle $\alpha_2$ relative from base 350 to the horizontal plane of inner lid surface 304, as shown in FIG. 3A.

In one embodiment, angle $\alpha_1$ and angle $\alpha_2$ have the same value or substantially the same value such that angle $\alpha_1$ and angle $\alpha_2$ each form a plane that is parallel or substantially parallel to the other. Therefore, splash guard 320 forms protective line of sight 325 to minimize entrance of chemical precursor 340 during splashes or bumps. In another embodiment, angle $\alpha_1$ and angle $\alpha_2$ have substantially different values. Therefore, angle $\alpha_2$ may be within a range from about 0° to about 70°, preferably from about 10° to about 50°, and more preferably, from about 20° to about 40°, for example, about 30°.

Inlet assembly 203 further contains inlet stem 310 connected to pneumatic valve assembly 210a. Inlet stem 310 contains stem tip 311 with a tapered angle $\alpha_3$ relative to the horizontal plane of inner bottom surface 306. Angle $\alpha_3$ may be positioned in the opposite direction of outlet stem 312 to minimize the amount of chemical precursor 340 splashed towards outlet stem 312. Generally, angle $\alpha_3$ may be within a range from about 0° to about 45°, preferably from about 5° to about 30°, and more preferably, from about 5° to about 15°, for example, about 10°.

Splash guard 320 may be formed from an assortment of materials including metal, ceramic or plastic. Splash guard 320 is generally fabricated from a material substantially inert to chemical precursor 340 and thus, the material of construction may vary based on the predetermined chemical precursor. Usually, splash guard 320 is fabricated from stainless steel, aluminum, iron, chromium, nickel, alloys thereof or combinations thereof, as well as ceramics, quartz or polymeric materials, such PETE, HDPE, fluorinated polymers, such as PTFE, PFA, TEFLON®, derivatives thereof or combinations thereof. Splash guard 320 may be fabricated from a single piece of material, such as sheet metal or meshing.

Figure 3B:
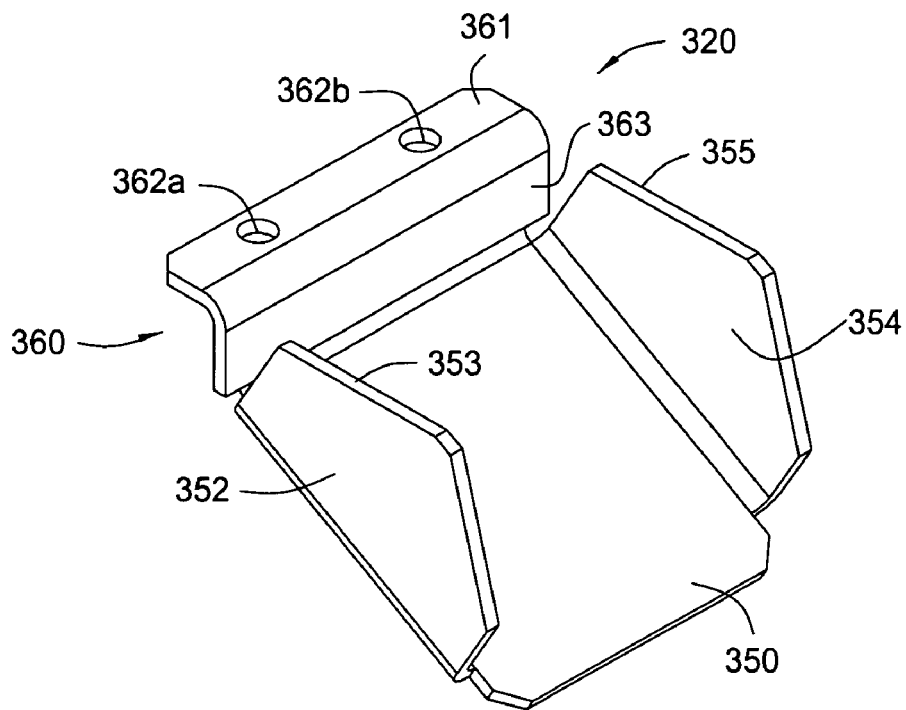
FIGS. 3B-3C are simplified schematic views of a splash guard as described by other embodiments herein.
Figure 3C:
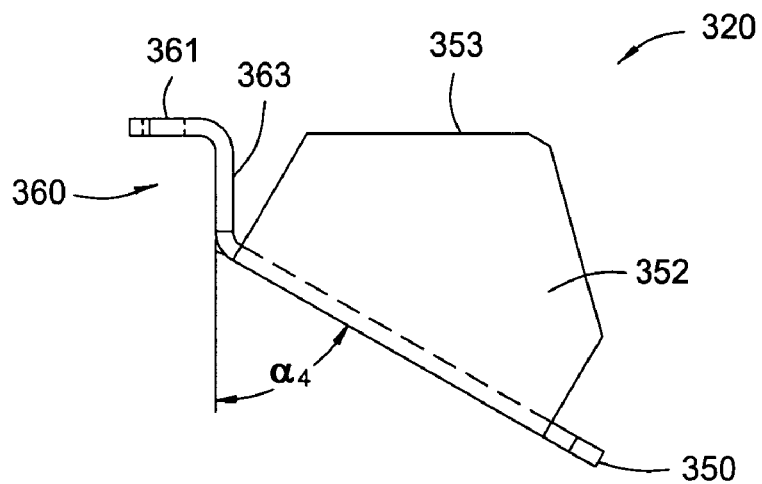

FIGS. 3B-3C are simplified schematic views of splash guard 320 containing base 350, guard walls 352 and 354 with top surfaces 353 and 355. During a process to form a process gas containing chemical precursor 340, carrier gas bubbling through ampoule 200 bumps or splashes chemical precursor 340 onto the surfaces of base 350 and guard walls 352 and 354. Since base 350 is positioned at angle $\alpha_2$ relative to the horizontal plane of inner lid surface 304, accumulated droplets of precursor on splash guard 320 drips back into the reserve of chemical precursor 340. Top surfaces 353 and 355 may contact inner lid surface 304 or seal 330 to form a more protective barricade around outlet tip 313.

Splash guard 320 also contains support assembly 360 with support top 361 having holes 362a and 362b and support side 363. Support top 361 may be attached to inner lid surface 304 or seal 330 by fasteners 322 protruding through holes 362a and 362b. In one embodiment, support top 361 and top surfaces 353 and 355 are flush against inner lid surface 304. Although base 350 is positioned at angle $\alpha_2$ relative to the horizontal plane of inner lid surface 304, base 350 is also positioned angle $\alpha_4$ relative to the horizontal plane of support side 363. Dependant on angle $\alpha_2$, the horizontal plane of support side 363 may be, but is not required to be perpendicular to the horizontal plane of inner lid surface. Therefore, angle $\alpha_4$ may be within a range from about 0° to about 90°, preferably from about 30° to about 80°, and more preferably, from about 45° to about 75°, for example, about 60°.

In an alternative embodiment, FIG. 4A depicts a cross sectional schematic view of ampoule 400 containing body 402 and lid 403 along with a variety of optional features and configurations. Body 402 contains inner wall surface 405 and inner bottom surface 406, while lid 403 contains inner lid surface 404. Seal 430 is disposed between lid 403 and body 402 to form a gas-tight seal for maintaining chemical precursor 416 within ampoule 400 and for maintaining air from entering ampoule 400. Seal 430 may cover a portion or all of inner lid surface 404. For example, seal 430 may cover a substantial portion of inner lid surface 404 and contain holes for accepting fasteners.

Ampoule 400 further contains splash guard 420 attached to inner lid surface 404. Fasteners 422, such as bolts, screws, rivets and the like, may protrude through seal 430 and into inner lid surface 404. Alternatively, splash guard 420 may be positioned onto inner lid surface by other techniques, such as with an adhesion or a welding. Also, splash guard 420 may be attached to inner wall surface 405 or inner bottom surface 406. Splash guard 420 is positioned at angle $\alpha_2$ relative from the horizontal plane of inner lid surface 404.

Inlet assembly 421 contains inlet stem 410a threaded into lid 403 and coupled to valve 460a. Inlet stem 410a contains stem tip 411a with a tapered angle $\alpha_3$ relative to the horizontal plane of inner bottom surface 406. Angle $\alpha_3$ may be positioned in the opposite direction of outlet stem 412 to minimize the amount of chemical precursor 416 splashed towards outlet stem 412.

FIGS. 4B-4E illustrate an assortment of stem tips for inlet stems. In one aspect, FIG. 4B depicts inlet stem 410b with stem tip 411b having a "J"-shape to direct the flow of carrier gas exiting stem tip 411b towards inner lid surface 404 within ampoule 400. Inlet stem 410b usually has an angle, relative from inlet stem 410b, within a range from about 135° to about 180°, preferably, from about 160° to about 180°, and more preferably, from about 170° to about 180°. In another aspect, FIG. 4C depicts inlet stem 410c with stem tip 411c having cap 415 obstructing the end of inlet stem 410c and at least one opening 417. Stem tip 411c may direct the flow of a carrier gas throughout ampoule 400. Usually carrier gas exiting opening 417 is typically directed perpendicular relative to inlet stem 410c. Therefore, the flow of a carrier gas is directed towards inner wall surface 405 to prevent direct (linear) gas flow through ampoule 400 and minimize bumps or splashes of chemical precursor 416. In another aspect, FIG. 4D depicts inlet stem 410d with stem tip 411d having a bent-shape stem to direct the flow of carrier gas towards inner wall surface 405. Stem tip 411d also prevents direct gas flow through ampoule 400 to minimize bumps or splashes of chemical precursor 416. Generally, inlet stem 410d has an angle, relative from inlet stem 410d, within a range from about 5° to about 175°, preferably, from about 45° to about 135°, and more preferably, from about 60° to about 120°, for example, about 90°. In another aspect, FIG. 4E depicts inlet stem 410e with stem tip 411e straight or relatively straight relative from inlet stem 410e. Stem tip 411e may direct flow of the carrier gas towards inner bottom surface 406. Inlet stem 410e usually has an angle, relative from inlet stem 410e, within a range from about 0° to about 20°, preferably, from about 0° to about 10°, and more preferably, from about 0° to about 5°.

Outlet assembly 423 contains outlet stem 412 threaded into lid 403 and coupled to valve 460b. Outlet stem 412 contains stem tip 413 with a tapered angle $\alpha_1$ relative to the horizontal plane of inner lid surface 404. Angle $\alpha_1$ may be positioned in the opposite direction of stem tip 411a to minimize the amount of chemical precursor 416 splashed into outlet stem 412. In an alternative embodiment, outlet stem 412 may substitute stem tip 413 with any of stem tips 411b-411e.

In one embodiment of ampoule 400, outlet assembly 423 contains trap 450 connected to outlet stem 412 by gas outlet 408. Chemical precursor 416 that is agitated (e.g., bumped or splashed) may form precursor droplets that are entrained within the carrier gas, bypass splash guard 420 and carried into outlet stem 412 towards the process chamber. Trap 450 is optionally coupled to gas outlet 408 for preventing such precursor droplets of chemical precursor 416 from reaching the process chamber. Trap 450 includes trap body 452 containing and a plurality of interleaved baffles 454 which extend past centerline 456 of trap body 452 and are angled at least slightly downward towards ampoule 400. Baffles 454 force the gas flowing towards the process chamber to flow a tortuous path around baffles 454. The surface area of baffles 454 provides an exposed area to adhere precursor droplets that may be entrained within the flowing process gas. The downward angle of baffles 454 allows any precursor droplets accumulated within trap 450 to flow downward and back into ampoule 400.

Ampoule 400 contains valve 460a for controlling the gas flow through inlet stem 410a and valve 460b for controlling the gas flow through outlet stem 412. Valves 460a and 460b may be pneumatic valves, manual valves or combinations thereof. Valve 460a may be directly connected to inlet stem 410a or merely in fluid communication with inlet stem 410a, such as coupled through lid 403, trap 450, another valve, a conduit or the like (not shown). Similarly, valve 460b may be directly connected to trap 450 and in fluid communication with outlet stem 412, such as coupled through a conduit, lid, another valve or the like (not shown). Generally, valve 460a may be anywhere between a carrier gas source and ampoule 400 while valve 460b may be anywhere between ampoule 400 and a process chamber.

Mating disconnect fittings containing female fittings 462A, 462B and male fittings 464a, 464b may be coupled to valves 460a, 460b to facilitate removal and replacement of ampoule 400 to and from gas delivery system 104. Valves 460a, 460b are typically ball valves or other positive sealing valves that allows ampoule 400 to be removed from gas delivery system 104 efficiently loaded and recycled while minimizing potential leakage from ampoule 400 during filling, transport or coupling to gas delivery system 104. Alternatively, ampoule 400 may be refilled through a refill port, such as refill port 218 in FIG. 3A.

In another embodiment of ampoule 400, at least one silo or baffle may be disposed between inlet stem 410a and outlet stem 412. Baffles 442c and 442d may extend from body 402, such as bottom surface 406, into the interior of ampoule 400. Baffles 442a and 442b may extend from lid 403, such as lid surface 404, into the interior of ampoule. Baffles 442a -442d create an extended mean flow path, thereby preventing direct (i.e., straight line) flow of the carrier gas from inlet stem 410a and outlet stem 412. An extended mean flow path increases the mean dwell time of the carrier gas in ampoule 400 and increases the quantity of vaporized precursor gas carried by the carrier gas. Additionally, baffles 442a -442d direct the carrier gas over the entire exposed surface of chemiQal precursor 416 disposed in ampoule 400, ensuring repeatable gas generation characteristics and efficient consumption of chemical precursor 416.

The number, spacing and shape of baffles 442a-442d may be selected to tune ampoule 400 for optimum generation of precursor gas. For example, a greater number of baffles 442a-442d may be selected to impart higher carrier gas velocities at chemical precursor 416 or the shape of baffles 442a-442d may be configured to control the consumption of chemical precursor 416 for more efficient usage of the precursor material. In one example, baffles 442a-442d disposed in ampoule 400 comprise rectangular plates fabricated of stainless steal. Baffles 442a-442d may be welded or otherwise fastened to bottom surface 406, lid 403 and/or inner wall surface 405, parallel or substantially parallel to each other. Baffles 442a-442d are interleaved, fastened to opposing sides of the canister in an alternating fashion to form a serpentine extended mean flow path, as illustrated in FIG. 4A.

In another embodiment, ampoule 400 and chemical precursor 416 therein may each be regulated at a predetermined temperature. FIG. 4A illustrates a sectional view of ampoule 400 surrounded by a heating media 470, which is configured to create a controllable temperature gradient between a lower region and an upper region of ampoule 400. In one example, heating media 470 is a canister heater containing heating element 472 disposed therein. In another example, heating media 470 is an insulating jacket heater containing heating element 472 disposed therein. Heating element 472 may be configured to generate more heat near a particular region of ampoule 400, such as a lower region or an upper region. Controller 474 may be used to regulate the temperature of ampoule 400 by adjusting power levels to heating element 472. Alternatively, a cooling apparatus (not shown) may be used to regulate the temperature of ampoule 400 and chemical precursor 416.

In another embodiment, ampoule 400 may contain particulates 418 in contact with chemical precursor 416 and aids in transferring heat throughout chemical precursor 416. The material of the particulates 418 is preferably one with high thermal conductivity and high heat capacity. Particulates 418 may be fabricated from a metal, such as stainless steel, aluminum, nickel, chromium, titanium, tungsten, tantalum, alloys thereof or combinations thereof. Particulates 418 may have any wide variety of shapes to provide varying surface areas useful for temperature regulation. For examples, particulates 418 may be spherical, cylindrical, conical, ellipsoidal, regular or irregular polyhedrons, other geometries, derivatives thereof or combinations thereof. Particulates 418 may have smooth, roughened or patterned surfaces or textures. Particulates 418 that include a roughened surface have a greater surface area available to assist temperature regulation of chemical precursor 416. Particulates 418 may have the same or different shapes and sizes, where the geometry of particulates 418 is generally selected depending upon a number of parameters, such as, density, porosity and composition of particulates 418, as well as, the internal volume and shape of ampoule 400, type of chemical precursor 416 and the desired amount of process gas generation during a deposition process.

Therefore, ampoule 400 provides many optional features that may be configured and utilized in tandem with any of the embodiments described herein. Further disclosure relating to optional ampoule accessories, such as step tips (inlet and outlet), disconnect fittings (male and female), traps, baffles, heater, temperature regulators, precursor particulates, is described in commonly assigned U.S. Pat. Nos. 6,905,541 and 6,915,592, commonly assigned and co-pending U.S. Ser. No. 10/281,079, filed Oct. 25, 2002, entitled, "Gas Delivery Apparatus for Atomic Layer Deposition," and published as US 2003-0121608, and commonly assigned and co-pending U.S. Ser. No. 10/198,727, filed Jul. 17, 2002, entitled, "Method and Apparatus for Providing Gas to a Processing Chamber," and published as US 2004-0013577, which are each incorporated herein in their entirety by reference to describe optional ampoule accessories and configurations.

Figure 5A:
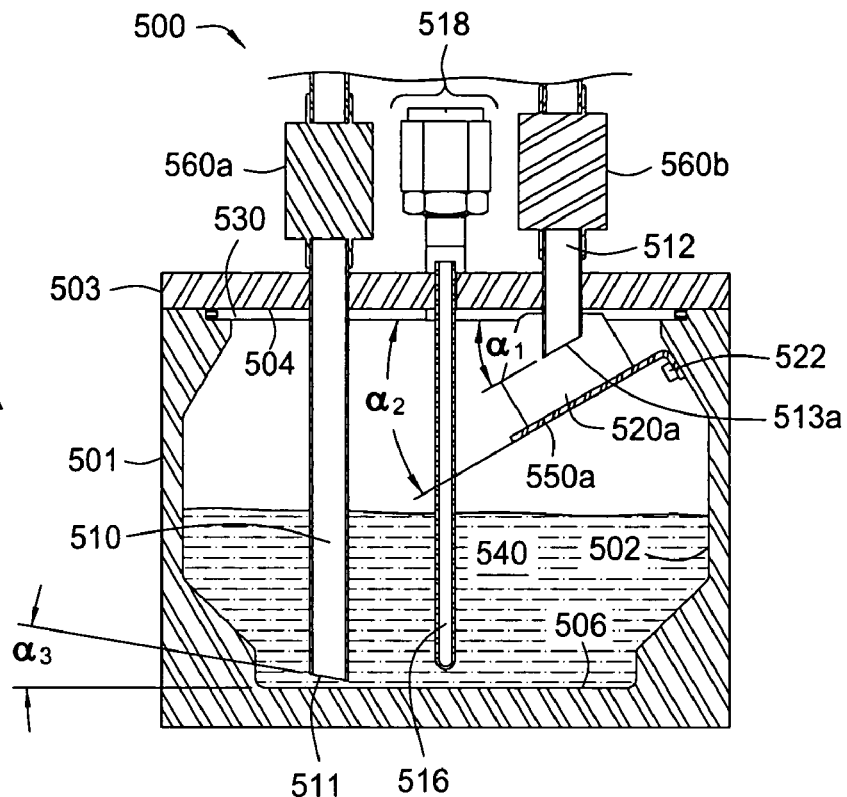
FIGS. 5A-5C are cross sectional schematic views of precursor ampoules and splash guards as described by alternative embodiments herein.
Figure 5B:
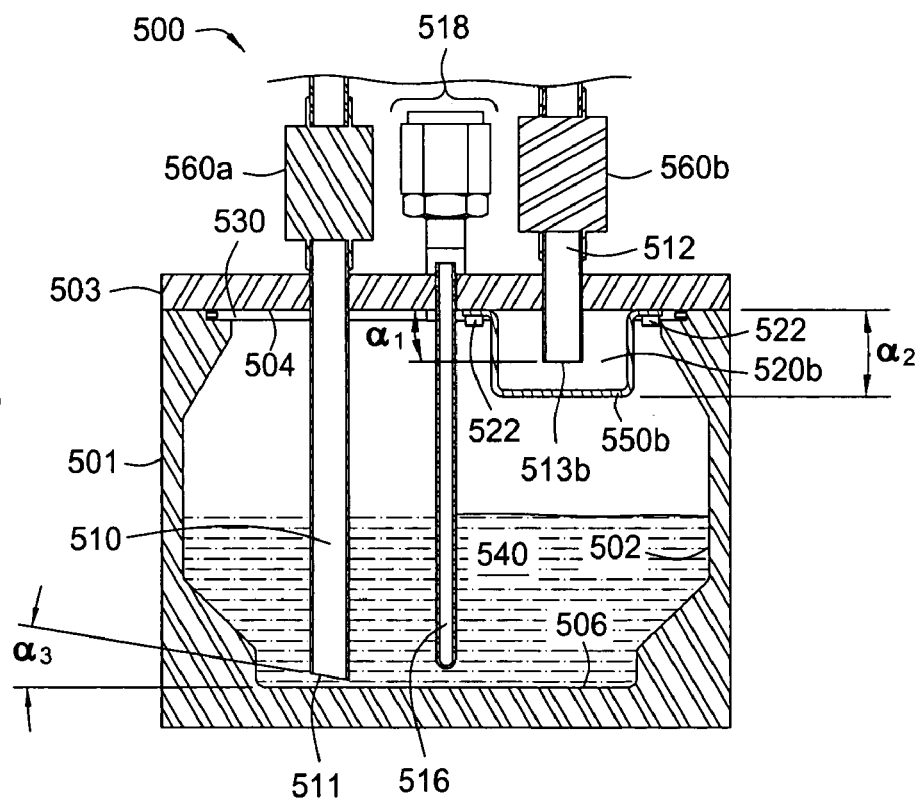
Figure 5C:
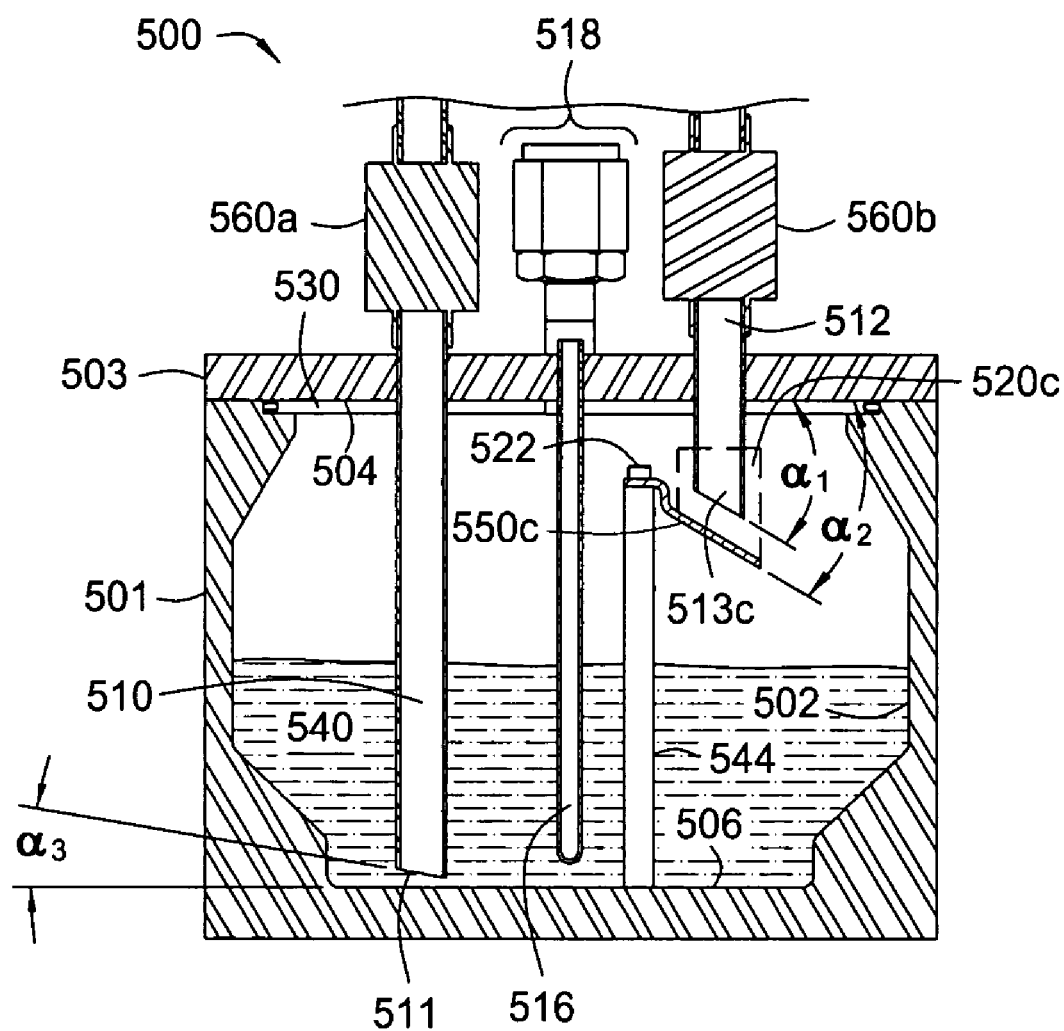

In another embodiment, FIGS. 5A-5C depicts cross sectional schematic views of ampoule 500 with splash guards 520a, 520b and 520c. Ampoule 500 contains inner wall surface 502, inner lid surface 504 and inner bottom surface 506. Seal 530 is disposed between lid 503 and body 501 to form a gas-tight seal for maintaining chemical precursor 540. Inlet stem 510 having stem tip 511 is connected to valve 560a and outlet stem 512 having stem tip 513 is connected to valve 560b. Ampoule 500 also contains re-fill port 518 and capped tube 516 protruding through lid 503 and into the interior of ampoule 500. valve 560b. Ampoule 500 also contains re-fill port 518 and capped tube 516 protruding through lid 503 and into the interior of ampoule 500.

Inlet stem 510 contains stem tip 511 with a tapered angle $\alpha_3$ relative to the horizontal plane of inner bottom surface 506. Angle $\alpha_3$ may be positioned in the opposite direction of outlet stem 512 to minimize the amount of chemical precursor 540 splashed towards outlet stem 512. Generally, angle $\alpha_3$ is within a range from about 0° to about 45°, preferably from about 5° to about 30°, and more preferably, from about 5° to about 15°, for example, about 10°.

Outlet stem may have stem tips 513a, 513b or 513c with a tapered angle $\alpha_1$ relative to the horizontal plane of inner lid surface 504. Generally, angle $\alpha_1$ is within a range from about 0° to about 70°, preferably from about 10° to about 50°, and more preferably, from about 20° to about 40°. In one example, stem tips 513a is configured with an angle $\alpha_1$ at about 30°. In another example, stem tips 513b is configured with an angle $\alpha_1$ at about 0°. In another example, stem tips 513c is configured with an angle $\alpha_1$ at about 45°.

Ampoule 500 further contains splash guards 520a, 520b or 520c attached to a variety of surfaces within ampoule 500, as illustrated in FIGS. 5A-5C. Splash guards 520a, 520b or 520c may be positioned at an angle $\alpha_2$ relative from bases 550a, 550b or 550c to the horizontal plane of inner lid surface 504. In FIG. 5A, splash guard 520a with base 550a is attached to inner wall surface 502 of body 501 by fasteners 522, an adhesion or a welding. FIG. 5B depicts splash guard 520b with base 550b attached to inner lid surface 504 of lid 503 by fasteners 522, an adhesion or a welding. In FIG. 5C, splash guard 520c with base 550c is attached to support 544 protruding from inner bottom surface 506 of body 501. In one example, support 544 is a silo or baffle. Splash guard 520c may be attached to support 544 by fasteners 522, by an adhesion or a welding, or be formed as a single piece. Generally, base 550a and stem tip 513a each form a plane that is parallel or substantially parallel to the other, base 550b and stem tip 513b each form a plane that is parallel or substantially parallel to the other, and base 550c and stem tip 513c each form a plane that is parallel or substantially parallel to the other, such that angle $\alpha_1$ and angles $\alpha_2$ have an equal value or substantially equal values for each pair of base 550 and stem tip 513. Fasteners 522 that may be used to secure splash guards 520a, 520b or 520c at a predetermined position within ampoule 500 may include bolts, screws, rivets or the like.

FIGS. 6A-6G depict schematic views of alternative splash guards 620a -620d and 620f that may be used throughout the embodiments described herein. Splash guards 620a-620d and 620f may be formed from an assortment of materials including metal, ceramic or plastic. Splash guards 620a-620d and 620f are generally fabricated from a material substantially inert to any chemical precursor for which it will endure exposure, thus, the material of construction may vary based on a predetermined chemical precursor. Usually, splash guards 620a-620d and 620f may be fabricated from stainless steel, aluminum, iron, chromium, nickel, alloys thereof or combinations thereof, as well as ceramics, quartz or polymeric materials, such PETE, HDPE, fluorinated polymers (e.g., PTFE, PFA, TEFLON®), derivatives thereof or combinations thereof. Splash guards 620a-620d and 620f may be fabricated from a single piece of material, such as sheet metal or mesh material.

Splash guard 620a contains base 650a, guard walls 652a and 654a with top surfaces 653a and 655a. During the processes described herein for forming a process gas containing a chemical precursor, a carrier gas bubbling through an ampoule, bumps or splashes a chemical precursor onto the surfaces of base 650a and guard walls 652a and 654a. Since base 650a may be positioned at an angle $\alpha_2$ relative to the horizontal plane of inner lid surface within an ampoule, droplets of chemical precursor that accumulate on splash guard 620a drain back into the chemical precursor reserve. Top surfaces 653a and 655a may contact an inner lid surface and/or a seal within an ampoule to form a more protective barricade around an outlet tip. Splash guard 620a contains support assembly 660a having support top 661a and support side 663a. Support top 661a may be attached to an inner lid surface and/or a seal by fasteners, an adhesion or a welding. In one embodiment, support top 661a and top surfaces 653a and 655a are aligned to be flush against an inner lid surface when positioned within an ampoule.

Figure 6A:
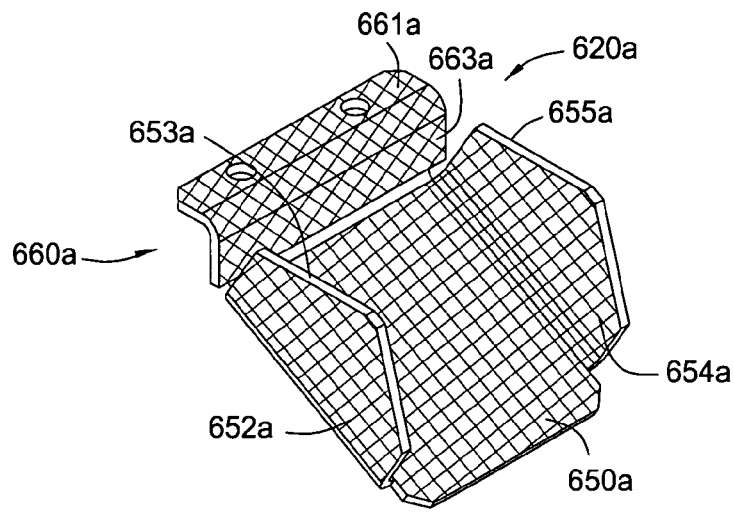
FIGS. 6A-6G are schematic views of splash guards as described by other embodiments herein.

FIG. 6a illustrates splash guard 620a fabricated from a mesh material, such as a metallic mesh or a polymeric mesh. The mesh material provides surfaces for the accumulation of chemical precursor droplets on base 650a and guard walls 652a and 654a while protecting a gas outlet. Chemical precursor accumulates on and drains from mesh material of base 650a. Mesh material may have a meshing hole or meshing aperture size within a range from about 0.037 mm to about 5.66, preferably, from about 0.074 mm to about 2.00, and more preferably, from about 0.149 mm to about 0.595 mm.

Figure 6B:
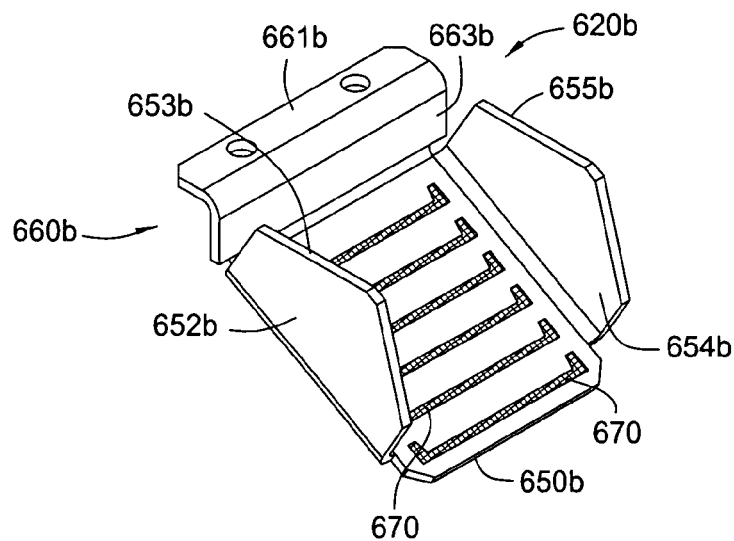
Figure 6C:
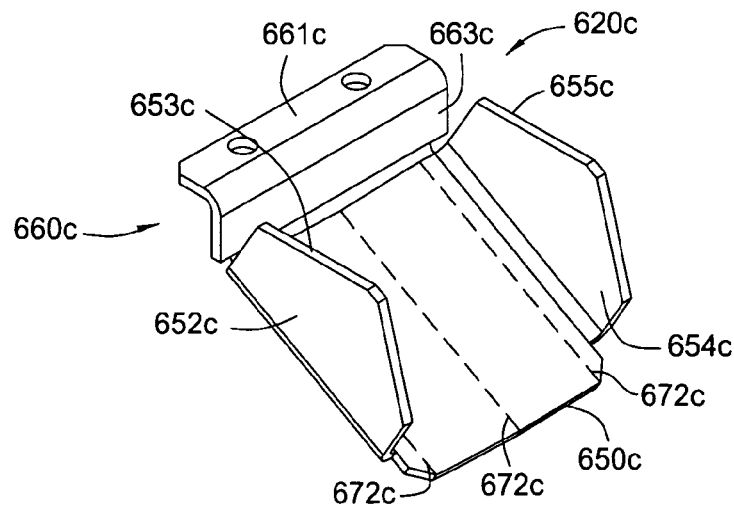

FIGS. 6B and 6C depict splash guards 620b and 620c containing bases 650b and 650c, guard walls 652b, 654b, 652c and 654c with top surfaces 653b, 655b, 653c and 655c. Base 650b contains slots 670 for draining of accumulated chemical precursor. Slots 670 may have a variety of geometries. Base 650c contains bends 672c to aid in accumulating and draining any chemical precursor droplets within the inside of splash guard 620c. Splash guards 620b and 620c further contain support assembly 660b and 660c having support tops 661b and 661c and support sides 663b and 663c.

Figure 6D:
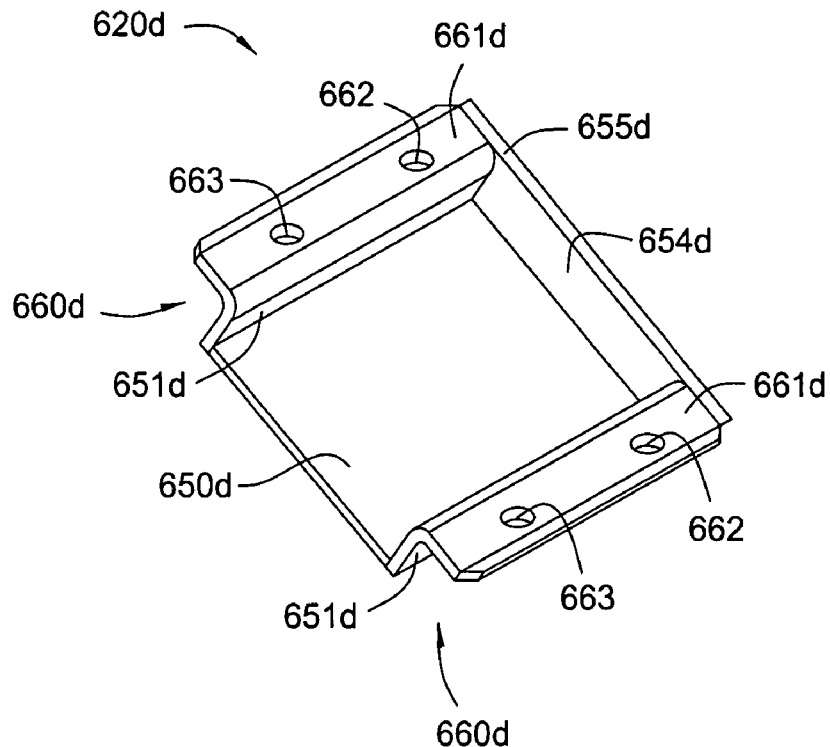
Figure 6E:
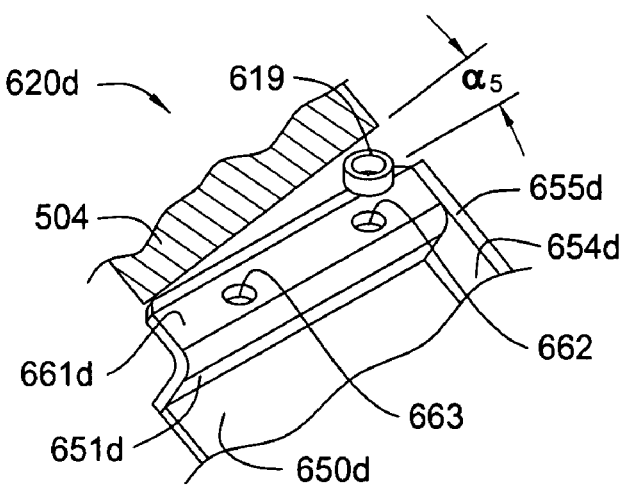
Figure 6F:
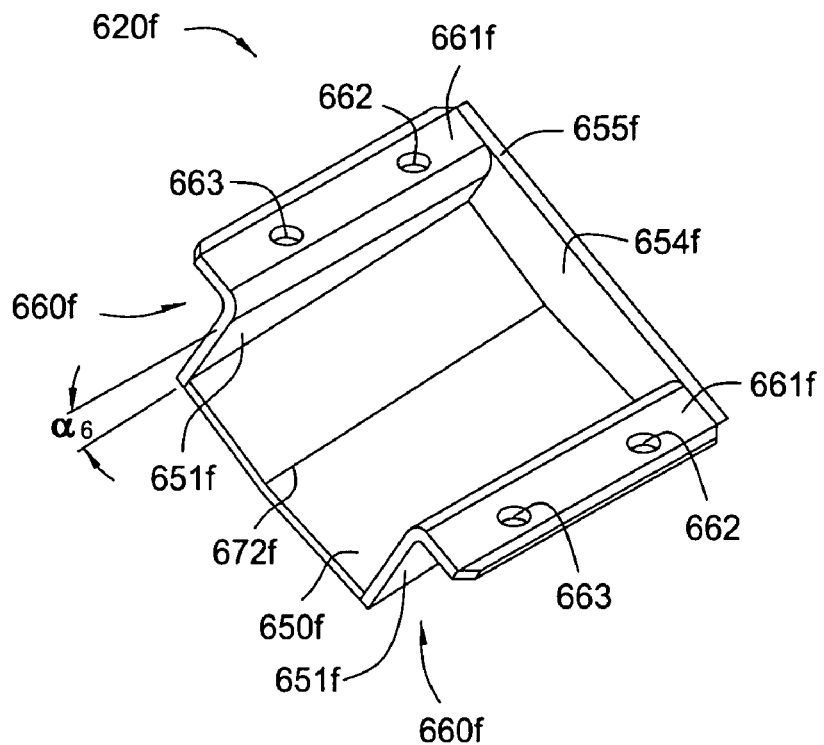

FIGS. 6D and 6F depict splash guards 620d and 620f containing bases 650d and 650f and guard walls 654d and 654f. Guard walls 654d and 654f have top surfaces 655d and 655f. Splash guards 620d and 620f further contain support assemblies 660d and 660f having support tops 661d and 661f, support sidewalls 651d and 651f and holes 662 and 663.

FIG. 6E depicts splash guard 620d being positioned to be secured onto inner lid surface 504 of lid 503 within an ampoule 500. In one embodiment, an angle $\alpha_5$ is formed by positioning splash guard 620d downwardly, away from inner lid surface 504, in order to provide drainage of any accumulated chemical precursor droplets. At least one spacer 619 may be placed between inner lid surface 504 and support top 661d to form angle $\alpha_5$. Spacer 619 may be held into place with a fastener passing through holes 662 and/or 663 of splash guard 620d, spacer 619 and into inner lid surface 504. Spacer 619 may be a bushing, a washer, a sleeve, derivates thereof or combinations thereof. Angle $a_5$ may be measured between the horizontal planes of inner lid surface 504 and support top 661d and may within a range from about 0° to about 45°, preferably from about 5° to about 35°, and more preferably, from about 10° to about 30°. In one aspect, spacer 619 may be incorporated with support assembly 660d as a single unit.

Figure 6G:
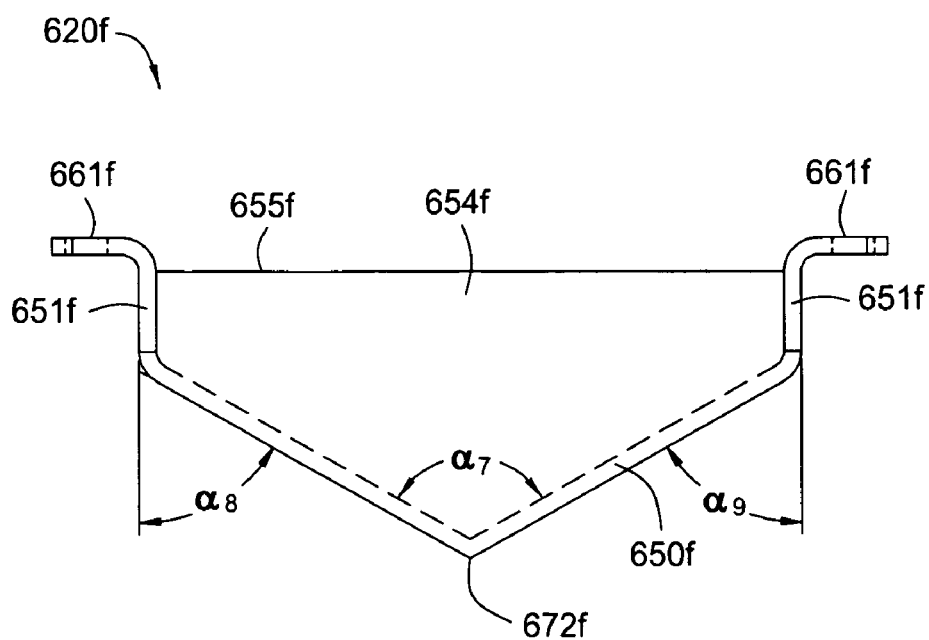

Splash guard 620f, as illustrated in FIG. 6F, contains support sidewall 651f tapering out from guard wall 654f, while as illustrated in FIG. 6D, splash guard 620d contains support sidewall 651d does not taper out from guard wall 654d. Therefore, base 650f is positioned downwardly, away from inner lid surface 504, in order to provide drainage of any accumulated chemical precursor droplets. Angle $\alpha_6$ may be within a range from about 0° to about 45°, preferably from about 5° to about 35°, and more preferably, from about 10° to about 30°. FIG. 6G depicts base 650f with bend 672f at an angle $\alpha_7$ to aid in accumulating and draining any chemical precursor droplets within the inside of splash guard 620f. Angle $\alpha_7$ may be within a range from about 90° to about 180°, preferably from about 100° to about 160°, and more preferably, from about 110° to about 150°.

Support assemblies 660f may each independently have angle $\alpha_8$ and angle $\alpha_9$ relative from the horizontal planes of base 650f to the horizontal planes of support sidewalls 651f. Dependant on angle $\alpha_7$, the horizontal planes of support sidewalls 651f may be, but is not required to be perpendicular to the horizontal plane of an inner lid surface. Therefore, each angle $\alpha_8$ and angle $\alpha_9$ is independently within a range from about 0° to about 90°, preferably from about 30° to about 80°, and more preferably, from about 45° to about 75° for example, about 60°.

Figure 7A:
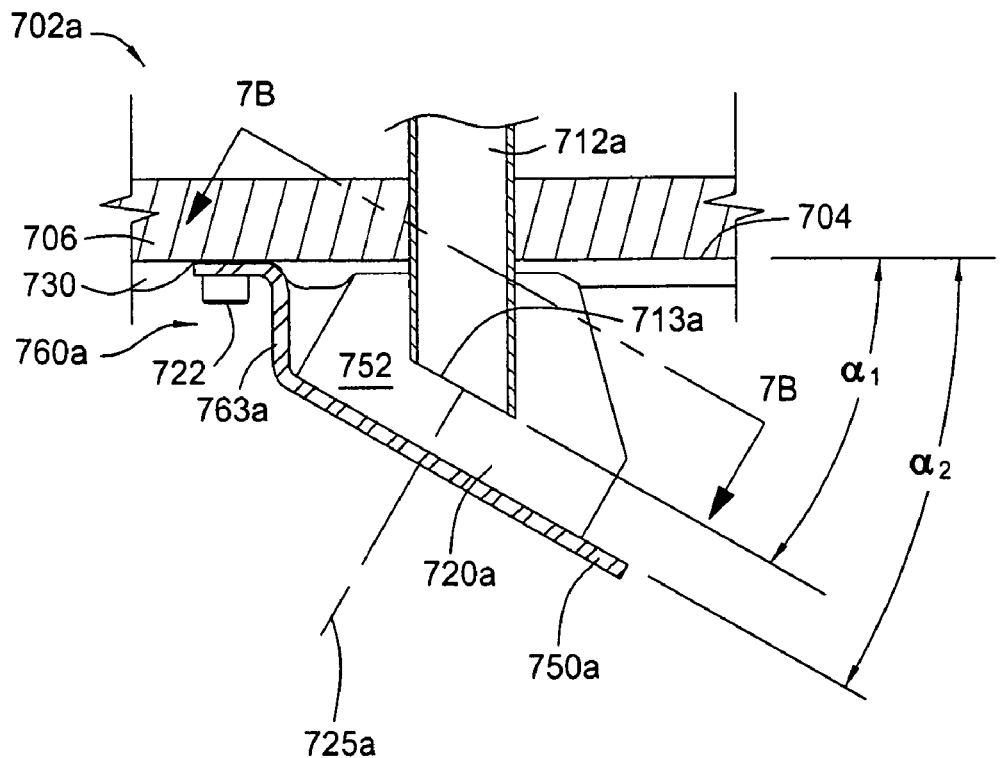
FIGS. 7A-7D are schematic views of splash guards as described by other embodiments herein.

FIG. 7A depicts a cross sectional schematic view of gas outlet assembly 702a that may be disposed within any of the ampoules described herein, such as ampoules 100, 200, 400 or 500. Gas outlet assembly 702a contains outlet stem 712a passing through lid 706 and further connected with other valves or conduits (not shown). Seal 730 may cover a portion or all of inner lid surface 704. For example, seal 730 may cover a substantial portion of inner lid surface 704 and contain holes for accepting fasteners 722. Outlet stem 712a contains stem tip 713a with an angle $\alpha_1$ relative to a plane along inner lid surface 704. Generally, angle $\alpha_1$ is within a range from about 0° to about 70°, preferably from about 10° to about 50°, and more preferably, from about 20° to about 40°. In one example, outlet stem 712a contains stem tip 713a with a tapered angle $\alpha_1$ of about 30° (FIG. 7A).

Splash guard 720a may be attached to inner lid surface 704. Fasteners 722, such as bolts, screws, rivets and the like, may protrude through seal 730 and into inner lid surface 704. Alternatively, splash guard 720a may be attached onto inner lid surface 704 by other techniques, such as with an adhesion or a welding. Splash guard 720a is positioned at angle $\alpha_2$ relative from base 750a to a horizontal plane of inner lid surface 704. Splash guard 720a may be positioned at an angle $\alpha_2$ within a range from about 0° to about 70°, preferably from about 10° to about 50°, and more preferably, from about 20° to about 40° relative to a plane along inner lid surface 704. In one embodiment, angle $\alpha_1$ and angle $\alpha_2$ have the same value or substantially the same value such that a plane along inner lid surface 704 at angle $\alpha_1$ is parallel or substantially parallel to a plane along base 750a at angle $\alpha_2$. Therefore, base 750a forms protective line of sight 725a to minimize entrance of a chemical precursor into stem tip 713a during splashes or bumps. In an alternative embodiment, angle $\alpha_1$ and angle $\alpha_2$ have substantially different values. In one example, splash guard 720a is positioned at angle $\alpha_2$ of about 30° (FIG. 7A).

Figure 7B:
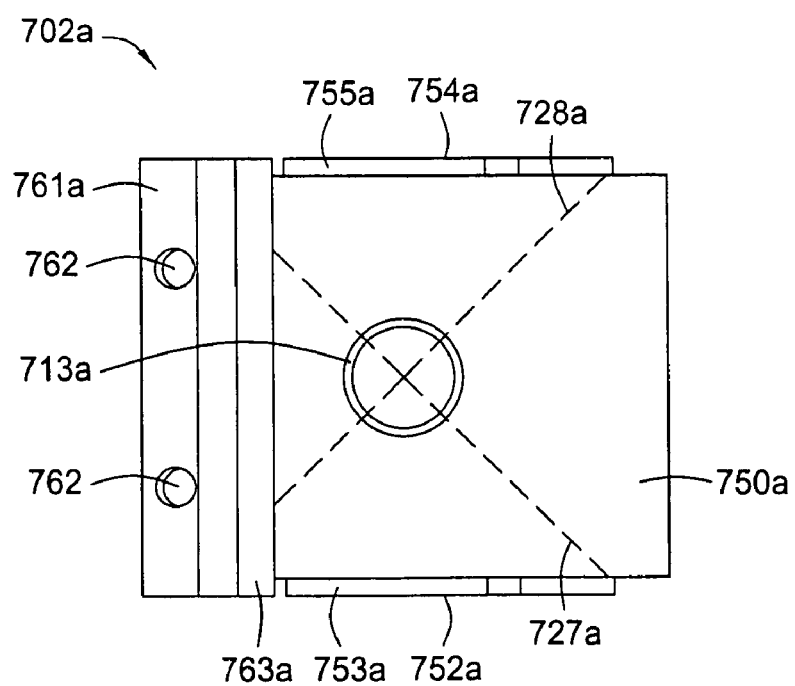

FIG. 7B depicts a top schematic view of gas outlet assembly 702a of FIG. 7A. Splash guard 720a contains base 750a, guard walls 752 and 754 with top surfaces 753a and 755a. Splash guard 720a also contains support assembly 760a with top surface 761a having holes 762 and support side wall 763a. During a process to form a process gas containing a chemical precursor, carrier gas bubbling through the ampoule bumps or splashes the chemical precursor onto the outer surfaces of base 750a and guard walls 752 and 754. Since base 750a is positioned at angle $\alpha_2$ relative to the horizontal plane of inner lid surface 704, accumulated droplets of precursor on splash guard 720a drips back into the chemical precursor reserve. Top surfaces 753a and 755a may contact inner lid surface 704 and/or seal 730 to form a more protective barricade around stem tip 713a.

FIG. 7B further illustrates lines 727a and 728a intersecting at 90° at the center of stem tip 713a. Similarly to how base 750a forms protective line of sight 725a, lines 727a and 728a illustrate that stem tip 713a is protected by support side wall 763a and guard walls 752 and 754 to minimize entrance of a chemical precursor into stem tip 713a during splashes or bumps. Support side wall 763a in combination with guard walls 752 and 754 may protect stem tip 713a on at least one side, preferably on at least two sides, and more preferably, on at least three sides. Therefore, support side wall 763a in combination with guard walls 752 and 754 may provide stem tip 713a with protection around at least one fourth of the perimeter, preferably, around at least one half of the perimeter, and more preferably, around at least three fourths of the perimeter of stem tip 713a.

Figure 7C:
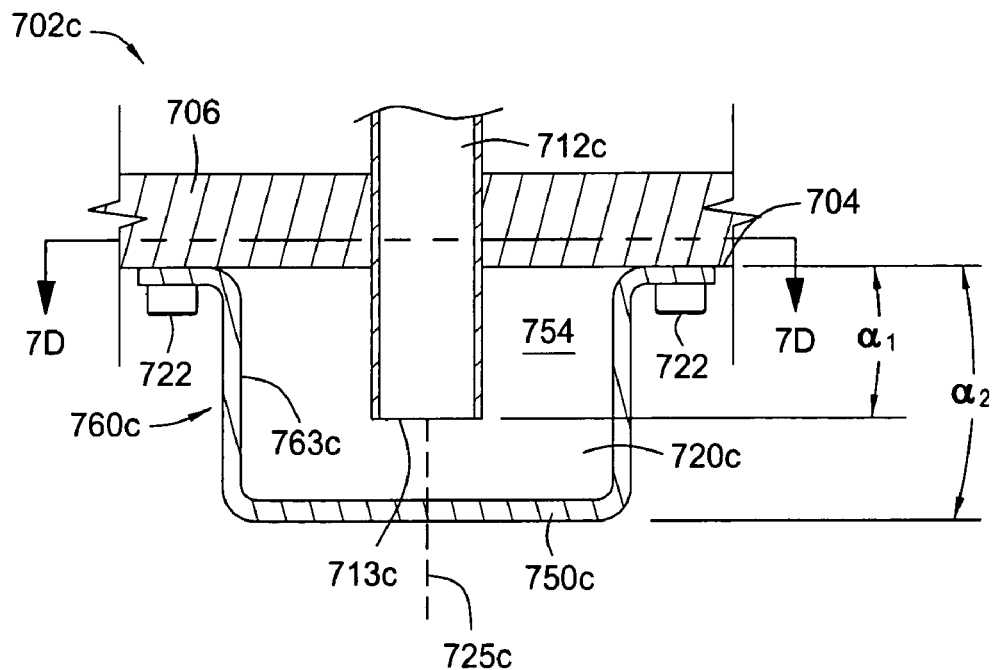

FIG. 7C depicts a cross sectional schematic view of gas outlet assembly 702c that may be disposed within any of the ampoules described herein, such as ampoules 100, 200, 400 or 500. Gas outlet assembly 702c contains outlet stem 712c passing through lid 706 and further connected with other valves or conduits (not shown). Outlet stem 712c contains stem tip 713c with an angle $\alpha_1$ relative to a plane along inner lid surface 704. Generally, angle $\alpha_1$ is within a range from about 0° to about 20°, preferably from about 0° to about 10°, and more preferably, from about 0° to about 5°. In one example, outlet stem 712c contains stem tip 713c with a tapered angle $\alpha_1$ of about 0° (FIG. 7C).

Splash guard 720c may be attached to inner lid surface 704. Fasteners 722, such as bolts, screws, rivets and the like, may protrude through seal 730 and into inner lid surface 704. Alternatively, splash guard 720c may be attached onto inner lid surface 704 by other techniques, such as with an adhesion or a welding. Splash guard 720c is positioned at angle $\alpha_2$ relative from base 750c to a horizontal plane of inner lid surface 704. Splash guard 720c may be positioned at an angle $\alpha_2$ within a range from about 0° to about 20°, preferably from about 0° to about 10°, and more preferably, from about 0° to about 5° relative to a plane along inner lid surface 704. In one embodiment, angle $\alpha_1$ and angle $\alpha_2$ have the same value or substantially the same value such that a plane along inner lid surface 704 at angle $\alpha_1$ is parallel or substantially parallel to a plane along base 750c at angle $\alpha_2$. Therefore, base 750c forms protective line of sight 725c to minimize entrance of a chemical precursor into stem tip 713c during splashes or bumps. In an alternative embodiment, angle $\alpha_1$ and angle $\alpha_2$ have substantially different values. In one example, splash guard 720a is positioned at angle $\alpha_2$ of about 0° (FIG. 7C).

Figure 7D:
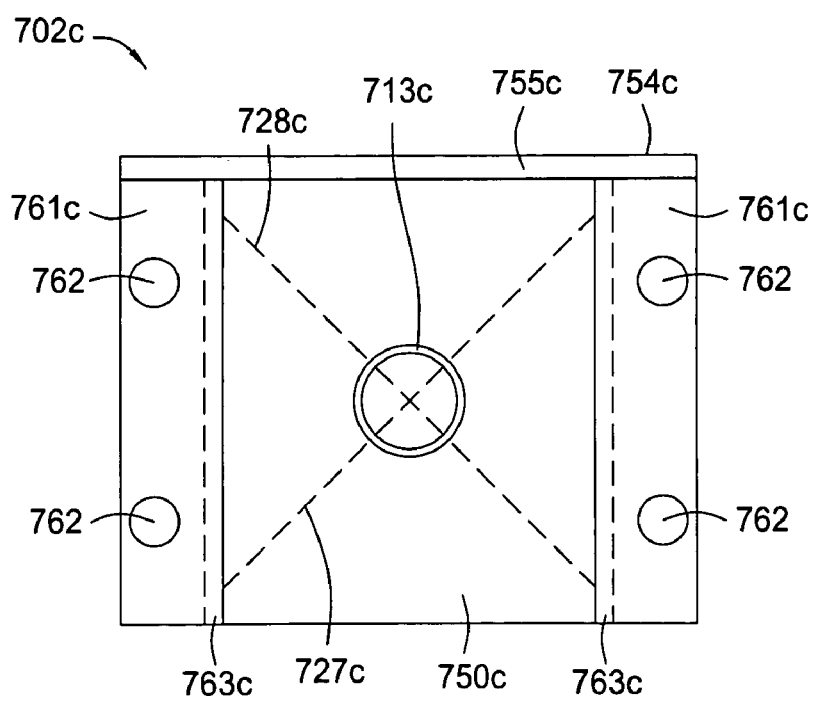

FIG. 7D depicts a top schematic view of gas outlet assembly 702c of FIG. 7C. Splash guard 720c contains base 750c, guard wall 754c having top surface 755c. Splash guard 720c also contains two support assemblies 760c with top surfaces 761c having holes 762 and support side walls 763c. Top surfaces 755c and 761c may contact inner lid surface 704 to form a more protective barricade around stem tip 713c.

FIG. 7D further illustrates lines 727c and 728c intersecting at 90° at the center of stem tip 713c. Lines 727c and 728c illustrate that stem tip 713c is protected by support side walls 763c and guard wall 754 to minimize entrance of a chemical precursor into stem tip 713c during splashes or bumps. Support side walls 763c in combination with guard wall 754 may protect stem tip 713c on at least one side, preferably on at least two sides, and more preferably, on at least three sides. Therefore, support side walls 763c in combination with guard wall 754 may provide stem tip 713c with protection around at least one fourth of the perimeter, preferably, around at least one half of the perimeter, and more preferably, around at least three fourths of the perimeter of stem tip 713c.

While the foregoing is directed to embodiments of the invention, other and further embodiments of the invention may be devised without departing from the basic scope thereof, and the scope thereof is determined by the claims that follow.

The invention claimed is:

1. An apparatus for generating a precursor gas used in a vapor deposition process system, comprising:
    an ampoule containing a body assembly and a lid;
    a gas inlet assembly positioned on the lid and configured to accept a carrier gas flow into the ampoule, wherein the gas inlet assembly comprises an inlet stem disposed within the ampoule and has a tapered tip at a first angle;
    a gas outlet assembly positioned on the lid and configured to accept a process gas flow from the ampoule, wherein the tapered tip of the inlet stem is positioned to face a direction substantially away from the gas outlet; and
    a splash guard positioned within the ampoule to obstruct a liquid precursor from entering or substantially entering the outlet.

2. The apparatus of claim 1, further comprising an outlet stem having a tip tapered at a second angle and connected to the gas outlet assembly, wherein the second angle is measured from an interior lid surface to a tip surface.

3. The apparatus of claim 2, wherein the second angle is within a range from about 0° to about 70°.

4. The apparatus of claim 3, wherein the second angle is within a range from about 10° to about 50°.

5. The apparatus of claim 4, wherein the first second angle is within a range from about 20° to about 40°.

6. The apparatus of claim 1, wherein the splash guard is positioned at a third angle measured from an interior lid surface to a guard surface.

7. The apparatus of claim 6, wherein the third angle is within a range from about 0° to about 70°.

8. The apparatus of claim 7, wherein the third angle is within a range from about 10° to about 50°.

9. The apparatus of claim 8, wherein the third angle is within a range from about 20° to about 40°.

10. The apparatus of claim 2, wherein the splash guard is positioned at a third angle measured from the interior lid surface to a guard surface.

11. The apparatus of claim 10, wherein the second angle is equal or substantially equal to the third angle.

12. The apparatus of claim 10, wherein the second angle and the third angle are each independently within a range from about 20° to about 40°.

13. The apparatus of claim 11, wherein the second angle and the third angle are each about 30°.

14. An apparatus for generating a precursor gas used in a vapor deposition process system, comprising:
    a canister containing a body assembly and a lid;
    a gas inlet positioned on the canister and configured to accept a carrier gas flow into the canister, wherein the gas inlet comprises an inlet stem disposed within the canister and has a tapered tip at a first angle;
    a gas outlet positioned on the lid and configured to accept a process gas flow from the canister, wherein the tapered tip of the inlet stem is positioned to face a direction substantially away from the gas outlet; and
    a splash guard attached to an inner surface of the canister and extending from the inner surface to obstruct a liquid precursor from entering the gas outlet.

15. The apparatus of claim 14, wherein the splash guard is positioned at a second angle measured from an interior lid surface to a guard surface.

16. The apparatus of claim 15, wherein the second angle is within a range from about 0° to about 70°.

17. The apparatus of claim 16, wherein the second angle is within a range from about 10° to about 50°.

18. The apparatus of claim 17, wherein the second angle is within a range from about 20° to about 40°.

19. The apparatus of claim 15, further comprising an outlet stem having a tip tapered at a third angle and connected to the outlet, wherein the third angle is measured from the interior lid surface to a tip surface.

20. The apparatus of claim 19, wherein the second angle is equal or substantially equal to the third angle.

21. The apparatus of claim 19, wherein the second angle and the third angle are each independently within a range from about 20° to about 40°.

22. The apparatus of claim 21, wherein the second angle and the third angle are each about 30°.

23. An apparatus for generating a precursor gas used in a vapor deposition process system, comprising:
- a canister containing a body assembly and a lid;
- a gas inlet positioned on the canister and configured to accept a carrier gas flow into the canister;
- a gas outlet configured to receive a process gas flowing from the canister;
- an outlet stem connected to the gas outlet containing a tapered tip having a first angle;
- an inlet stem connected to the gas inlet and disposed within the canister, wherein the inlet stem comprises a tapered tip at a second angle and is positioned such that the angle of the tapered tip faces a direction substantially away from the gas outlet; and
- a splash guard within the canister containing a surface positioned at a second angle, wherein the first angle and the second angle are equal or substantially equal to each other.

24. An apparatus for generating a precursor gas used in a vapor deposition process system, comprising:
- a canister containing a lid and a body assembly configured to hold a liquid precursor;
- a gas inlet positioned on the canister and configured to accept a carrier gas flow into the canister, the gas inlet comprising a gas inlet stem disposed within the canister and having a tapered tip at a first angle;
- a gas outlet positioned on the lid and configured to accept a process gas flow from the canister, wherein the tapered tip of the inlet stem is positioned to face a direction substantially away from the gas outlet; and
- a splash guard positioned within the canister and positioned between the gas outlet and a bottom surface of the body assembly, wherein the splash guard is positioned to substantially obstruct the liquid precursor from entering the gas outlet.

25. An apparatus for generating a precursor gas used in a vapor deposition process system, comprising:
- a canister containing a body assembly and a lid;
- a gas inlet positioned on the canister and configured to accept a carrier gas flow into the canister, the gas inlet comprising a gas inlet stem disposed within the canister and having a tapered tip at a first angle;
- a gas outlet positioned on the lid and configured to accept a process gas flow from the canister, wherein the tapered tip of the inlet stem is positioned to face a direction substantially away from the gas outlet; and
- a splash guard attached to an inner surface of the canister and extending from the inner surface to obstruct a liquid precursor from entering the gas outlet, wherein the splash guard is at a second angle within a range from about 10° to about 50° from an interior lid surface.

26. The apparatus of claim 1, further comprising a thermocouple coupled to the lid and positioned within the ampoule.

* * * * *

UNITED STATES PATENT AND TRADEMARK OFFICE
CERTIFICATE OF CORRECTION

| | | |
|---|---|---|
| PATENT NO. | : 7,464,917 B2 | Page 1 of 1 |
| APPLICATION NO. | : 11/246890 | |
| DATED | : December 16, 2008 | |
| INVENTOR(S) | : Lee et al. | |

It is certified that error appears in the above-identified patent and that said Letters Patent is hereby corrected as shown below:

Column 3, Line 25, delete "other embodiments" and insert --another embodiment-- therefor;

Column 4, Lines 29-30, please delete "utilized as sensor 126 is available from Davis Instruments, Inc., located in Baltimore, Md.";

Column 10, Line 46, please delete "chemiQal" and insert --chemical-- therefor;

Column 10, Line 58, please insert --four-- after comprise;

Column 11, Lines 65-67, please delete "valve 560b. Ampoule 500 also contains re-fill port 518 and capped tube 516 protruding through lid 503 and into the interior of ampoule 500.";

Column 16, Claim 5, Line 24, please delete "first".

Signed and Sealed this

Fourteenth Day of September, 2010

David J. Kappos
*Director of the United States Patent and Trademark Office*